United States Patent
Yusa et al.

(10) Patent No.: US 7,758,923 B2
(45) Date of Patent: Jul. 20, 2010

(54) METHOD OF PRODUCING A METALLIZED MOLDED ARTICLE UTILIZING A PRESSURIZED FLUID CONTAINING A METAL COMPLEX

(75) Inventors: Atsushi Yusa, Ibaraki (JP); Yoshiyuki Nomura, Ibaraki (JP); Harumi Hieida, Saga (JP)

(73) Assignee: Hitachi Maxell Ltd., Ibaraki (JP)

( * ) Notice: Subject to any disclaimer, the term of this patent is extended or adjusted under 35 U.S.C. 154(b) by 560 days.

(21) Appl. No.: 11/505,487

(22) Filed: Aug. 17, 2006

(65) Prior Publication Data

US 2007/0190310 A1    Aug. 16, 2007

(30) Foreign Application Priority Data

Aug. 18, 2005 (JP) .............................. 2005-237395
Aug. 15, 2006 (JP) .............................. 2006-221394

(51) Int. Cl.
B05D 3/10 (2006.01)
B05D 7/04 (2006.01)
B29C 70/88 (2006.01)
B32B 5/16 (2006.01)
B32B 15/08 (2006.01)

(52) U.S. Cl. ..................... 427/304; 264/82; 264/129; 264/210.6; 428/323; 428/457

(58) Field of Classification Search ............. None
See application file for complete search history.

(56) References Cited

U.S. PATENT DOCUMENTS

| 6,328,916 B1 * | 12/2001 | Nishikawa et al. ............. 264/53 |
| 6,955,781 B2 * | 10/2005 | Yusa et al. ................. 264/162 |
| 7,211,207 B2 * | 5/2007 | Yusa et al ..................... 264/50 |
| 2003/0228485 A1 * | 12/2003 | Yusa et al. .................. 428/577 |

FOREIGN PATENT DOCUMENTS

| JP | A 2-88212 | 3/1990 |
| JP | A 3-82513 | 4/1991 |
| JP | A 5-315829 | 11/1993 |
| JP | A 6-87964 | 3/1994 |
| JP | A 08-090587 | 4/1996 |
| JP | A 9-59778 | 3/1997 |
| JP | A 11-239529 | 9/1999 |
| JP | A 2000-35509 | 2/2000 |
| JP | A 2000-73178 | 3/2000 |
| JP | A 2001-303255 | 10/2001 |

(Continued)

OTHER PUBLICATIONS

Teruo Hori, "Latest Applied Technology of Supercritical Fluid", NTS Inc., pp. 250-255, 2004.

*Primary Examiner*—Monique R Jackson
(74) *Attorney, Agent, or Firm*—Oliff & Berridge, PLC

(57) ABSTRACT

The present invention provides a method of producing a molded article, which can be perform the continuous processes and effectively impregnate a modifying material such as metal complexes in the thermoplastic resin for short period of time. The above object is achieved by providing the method of producing the thermoplastic resin molded article which includes impregnating the high-pressure fluid having a modifying material dissolved therein, in thermoplastic resin, and continuously molding the thermoplastic resin in which the modifying material has been impregnated, into the form of a film.

8 Claims, 10 Drawing Sheets

FOREIGN PATENT DOCUMENTS

| | | |
|---|---|---|
| JP | A 2001-341186 | 12/2001 |
| JP | A 2002-273777 | 9/2002 |
| JP | A 2004-148638 | 5/2004 |
| JP | A 2004-218062 | 8/2004 |
| JP | A 2004-249468 | 9/2004 |
| JP | A 2005-97563 | 4/2005 |
| JP | A 2005-205898 | 8/2005 |

* cited by examiner

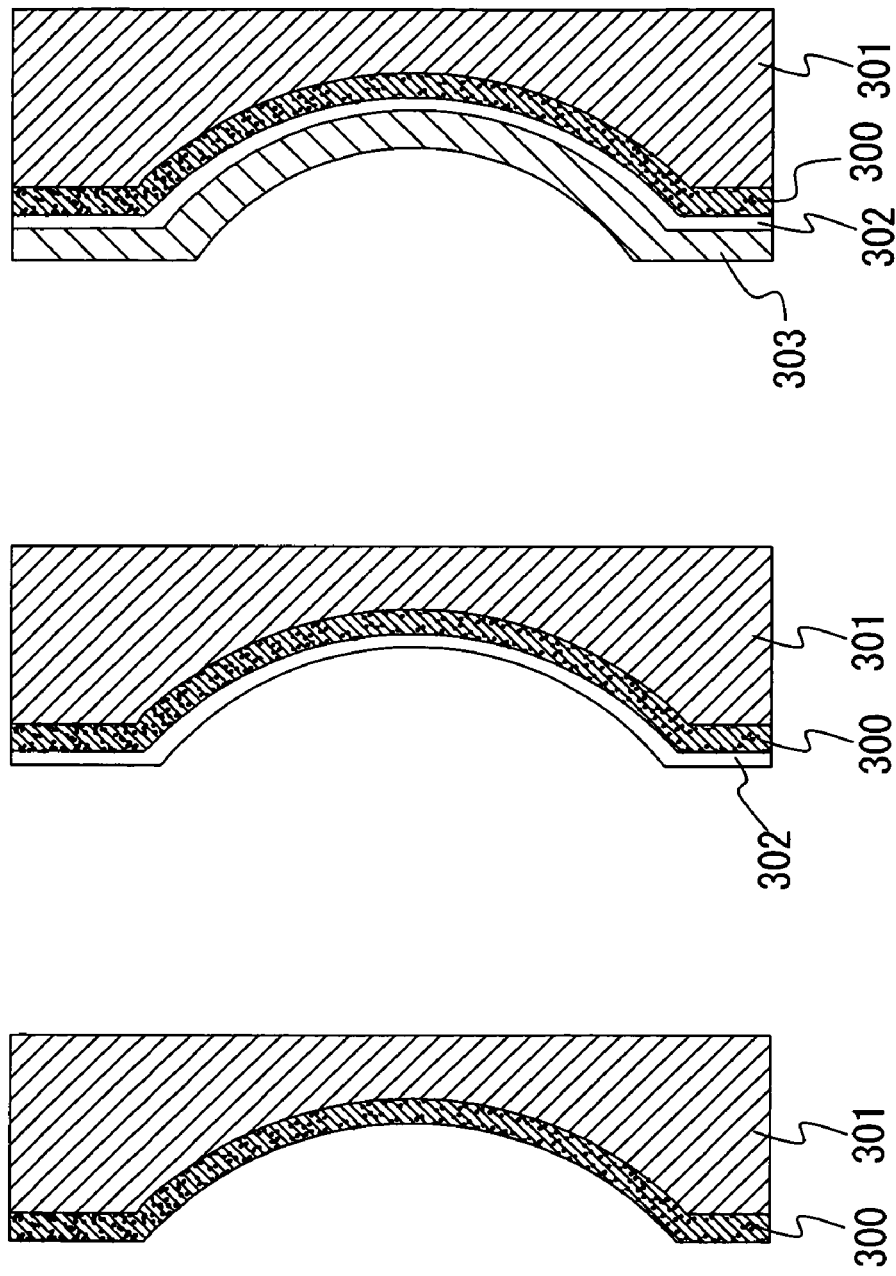

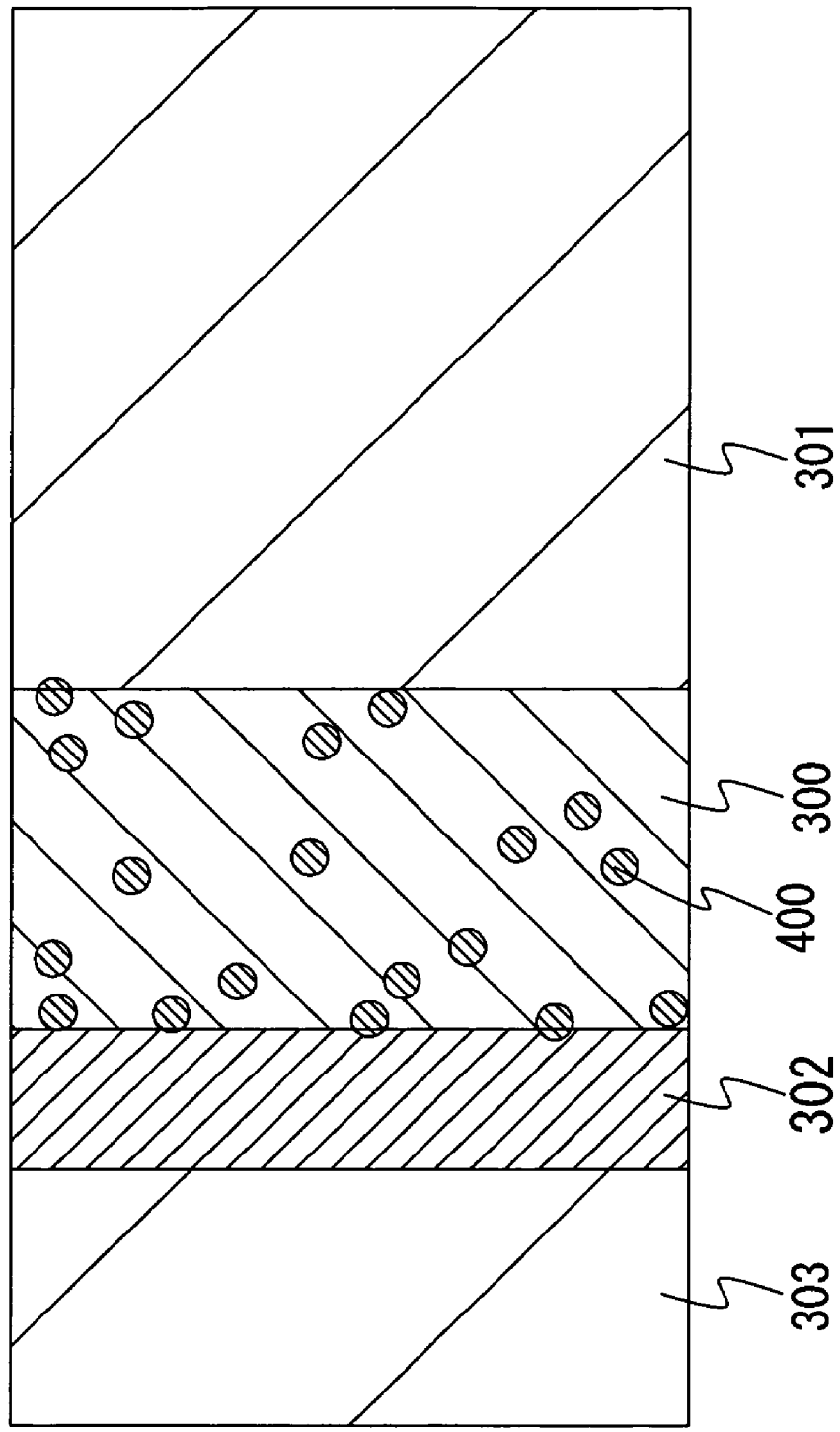

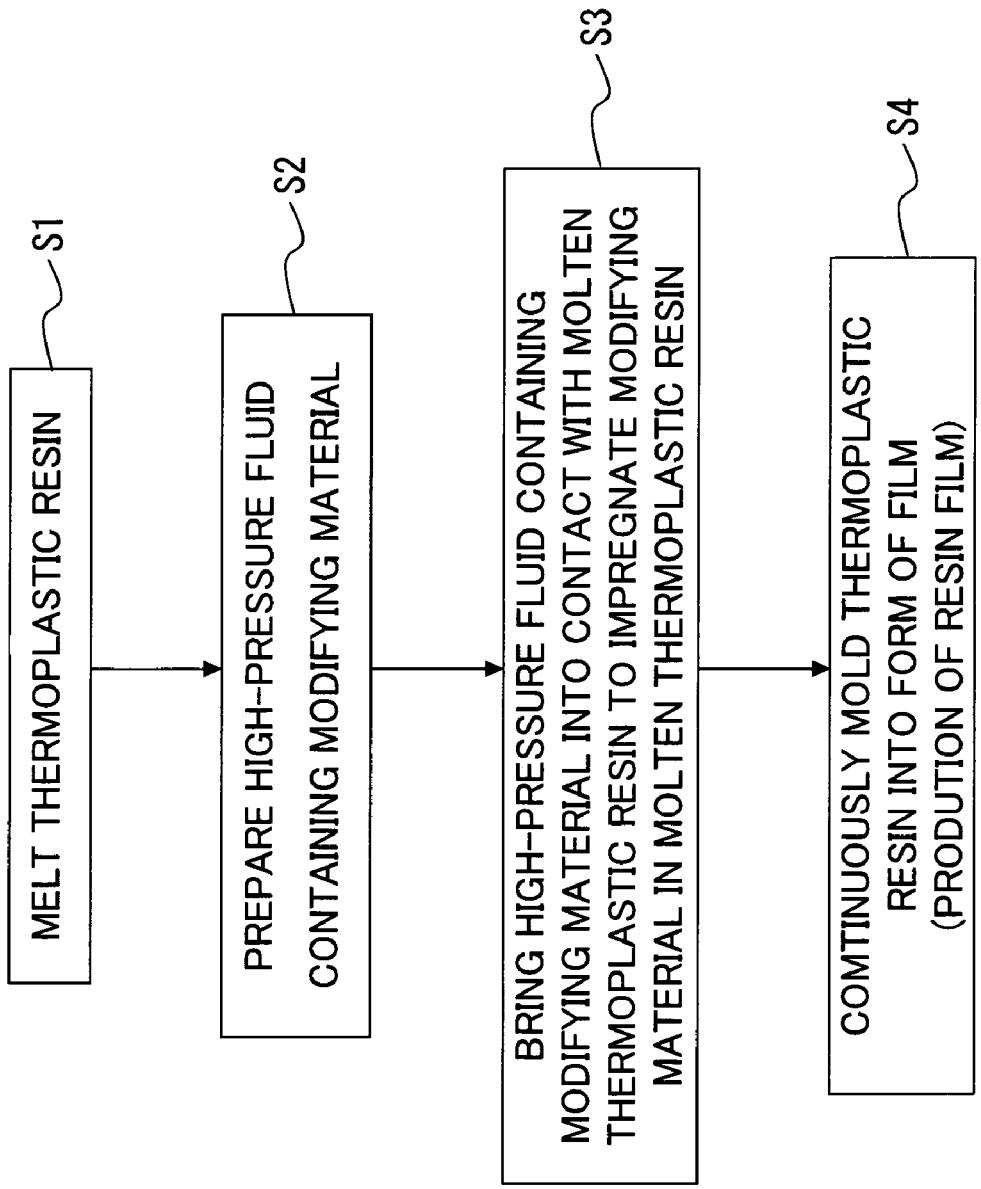

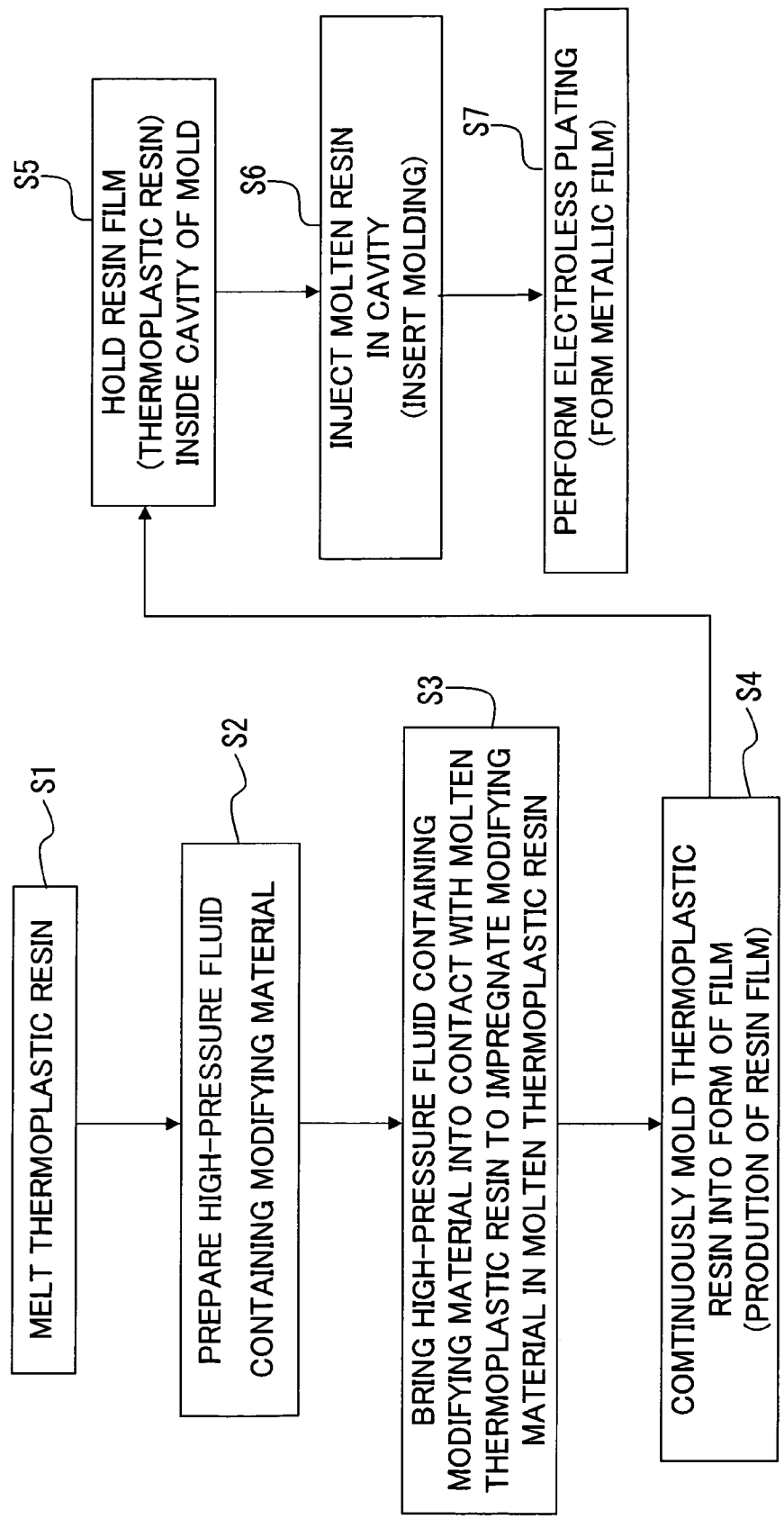

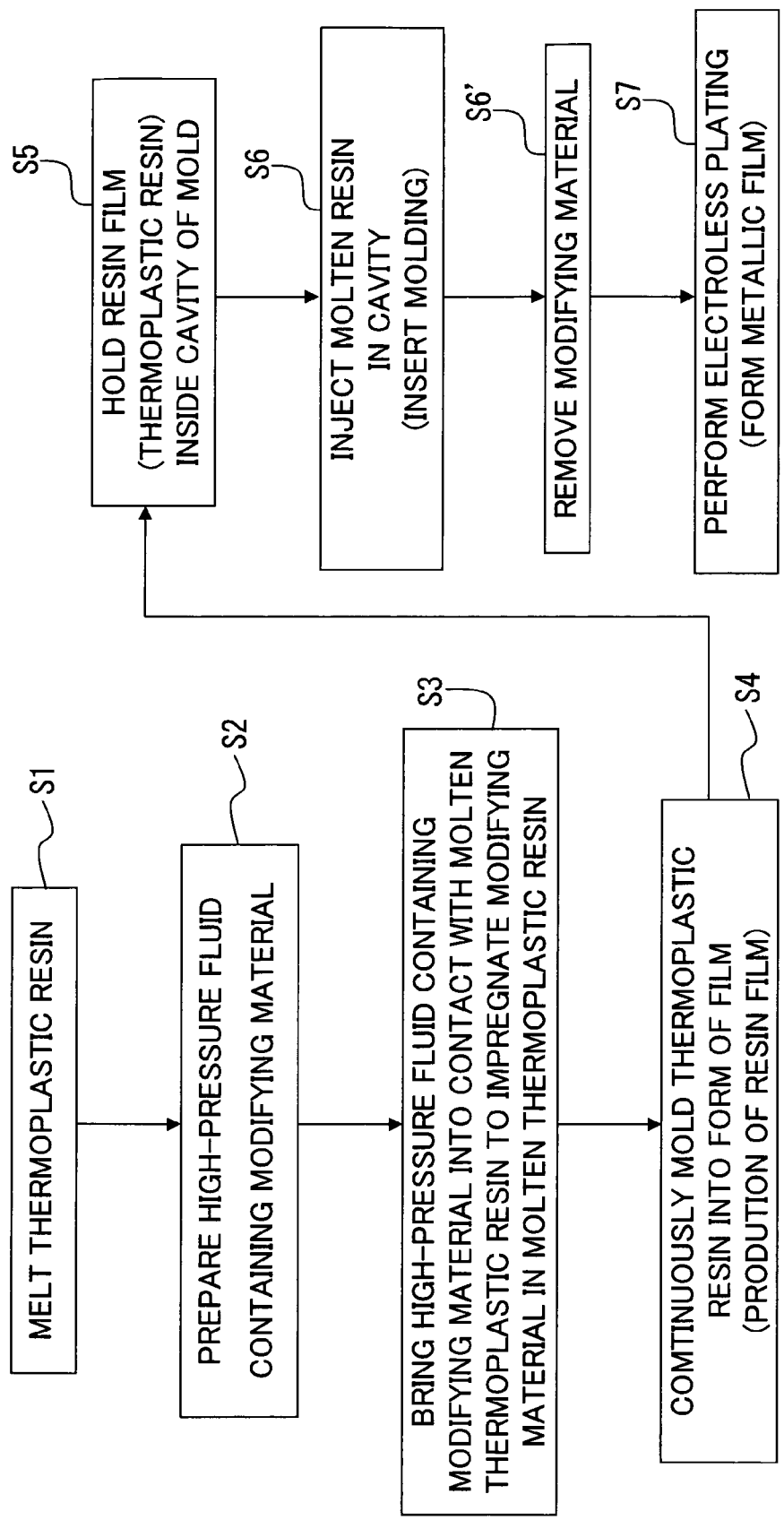

METHOD OF PRODUCING A METALLIZED MOLDED ARTICLE UTILIZING A PRESSURIZED FLUID CONTAINING A METAL COMPLEX

BACKGROUND OF THE INVENTION

1. Field of the Invention

The present invention relates to a method of producing a molded article, an extruder, and a molded article. Particularly the present invention relates to a method of producing a molded article using a high-pressure fluid, an extruder used in this production method, and a molded article which is produced by this production method.

2. Description of the Related Art

As a forming method (production method) for creating a molded article with thermoplastic resin (referred to as "resin molded article" hereinafter), injection molding and extrusion molding have been widely used conventionally. In the extrusion molding, a thermoplastic resin material such as pellet is plasticized and molten by a screw rotating inside a heating cylinder of an extruder and the molten resin is continuously poured into an internal pressure die (base), whereby a molded article with a constant cross sectional shape can be obtained. Therefore, extrusion molding is suitable as a method for continuously producing, for example, a thermoplastic resin film, sheet, pipe, and the like.

There has been conventionally proposed a method in which supercritical fluid is used for the above-mentioned extrusion molding. Specifically, there is proposed a foam extrusion molding method for forming fine foam cells inside a molded article by using supercritical fluid as a pneumatogen (see, for example, Japanese Patent Application Laid-Open No. 2001-341186). Moreover, there is proposed an extrusion molding method of mixing, and milling supercritical fluid with molten resin while improving plasticization/melting performance of a material which has high glass-transition temperature and is difficult to be molded by using supercritical fluid as a plasticizer (see, for example, Japanese Patent Application Laid-Open No. 2002-273777).

Furthermore, extrusion molding is expected as a method of molding a liquid crystal polymer film and a method of forming a metallic thin film on a surface of the polymer film. The reason is because liquid crystal polymer, which is thermoplastic resin, has high heat resistance and excellent thermal dimensional stability and a high-frequency electric property, and thus is promising as a material such as a flexible circuit board.

However, generally, because thermoplastic liquid crystal polymer has low melting viscosity, and molten liquid crystal polymer molecules are easily oriented in one direction when being extruded from a die, thermoplastic liquid crystal polymer has a disadvantage that a liquid crystal polymer film is split easily in one direction. Therefore, in order to eliminate such disadvantage of liquid crystal polymer film, there is proposed a method of molding a liquid crystal polymer film by means of inflation molding (see Japanese Patent Application Laid-Open No. H2-88212). In Japanese Patent Application Laid-Open No. H2-88212, there is proposed a method of braking one direction of the molecular orientations in an unsolidified (semisolid) film obtained by being ejected from a die, the liquid crystal polymer molecules in the film being oriented in one direction. Here, inflation molding is a method in which molten resin is extruded through a circular die (spiral die or the like) to mold a tubular resin bubble, then air is blown into the tubular resin bubble to expand and cool the resin bubble, and thereby a tubular film having a desired diameter is molded.

Moreover, as a method of forming a metallic film on a resin molded article, a spattering method, a vapor deposition method, or the like are conventionally known. However, costs are high for these methods since the devices used are expansive and vacuum processing is performed. On the other hand, as a low-cost metallic film formation method, an electroless plating process is commonly known.

The procedures for forming a metallic film on a resin molded article by the electroless plating process vary slightly in accordance with the materials to be used. However, normally, after a resin molded article is produced in a molding process such as an extrusion molding process, the molded article is degreased. Next, various steps of etching, neutralization and wetting, addition of catalysts, and activation of the catalysts are carried out, and thereafter the molded article is immersed in electroless plating solution to form a metallic film on the molded article. In electroless plating, a film having high reflectance, such as a gold film, silver film, copper film, or nickel film can be coated as the metallic film on a polymer surface. Moreover, there is a case in which the molded article on which an electroless plating film (metallic film) is formed is subjected to electrolytic plating to make the thickness of the metallic film thicker.

The etching step in the above electroless plating process is performed for the purpose of improving the adhesion between the catalysts and the resin due to an anchor effect obtained by roughening a surface of the molded article. In the etching step, chromic acid solution, alkali metal hydroxide solution or the like is used as the etching solution, but such etching solution is required to be subjected to after-treatment such as neutralization and the like, thus use of the etching solution is a factor of increased cost. Moreover, since such etching solution has high toxicity, the problem is that the handling of such etching solution is troublesome.

Therefore, there have been conventionally proposed several plating processes which do not require roughening of a surface of the molded article by etching. For example, there is proposed a process of forming a thin film, which contains a plating catalyst, on a plastic surface by using an organic binder or ultraviolet curable resin (see, for example, Japanese Patent Application Laid-Open No. H9-59778 and Japanese Patent Application Laid-Open No. 2001-303255). Further, there is proposed a technology in which an ultraviolet laser is irradiated onto a plastic surface in an atmosphere of gas such as amine compound to modify the plastic surface (see, for example, Japanese Patent Application Laid-Open No. H6-87964). There is also proposed a technology for modifying a plastic surface by means of corona discharge processing, plasma processing, ultraviolet treatment or the like.

Moreover, in order to overcome the problem of the above-mentioned conventional technology of forming electroless plating film, there is proposed an electroless plating method for plastic using supercritical fluid (see, for example, "Latest Applied Technology of Supercritical Fluid", Teruo Hori, NTS Inc. Pg. 250 through 255, 2004). According to the method described in "Latest Applied Technology of Supercritical Fluid", organic metal complexes are dissolved in a supercritical carbon dioxide, thus the supercritical carbon dioxide is brought into contact with various polymers, and thereby metal complexes are injected into polymer surfaces. Then, the metal complexes are reduced by applying heat thereto or by means of chemical reduction treatment to deposit the metallic fine particles on the polymer surfaces. Accordingly, the entire polymer surfaces can be subjected to electroless plating.

Therefore, it is mentioned in "Latest Applied Technology of Supercritical Fluid" that according to this process, waste liquid treatment is not required to be performed, thus an electroless plating process in which a resin with excellent surface roughness can be obtained is achieved.

Incidentally, as an example of the molded article which is obtained by forming a metallic film on a resin molded article, there is a light reflecting body such as a reflector used in an automotive lamp, and recently instead of using thermoset resin, thermoplastic resin such as polyester resin and polycarbonate resin that can be produced massively is used as a resin material for such light reflecting body. Since the temperature inside the head lamp increases, a reflector which has a heat resistance of 160° C. through 180° C. and in which the metallic reflection coatings are not separated is required.

As a method of forming a metallic reflection coating on the surface of such molded article (polymer base material), there is proposed a method of forming a metallic film by means of vapor deposition (direct vapor deposition method) after the surface of the molded article is subjected to plasma activation. However, in the reflector which is produced in this method, there is a problem that the light reflection coating is fogged when the reflector is held in a high-temperature environment for a long time. The cause of this fogging is separation between the metallic film and the polymer base material. The causes of the separation include thermal expansion or deformation of the polymer base material, thermolysis gas generated from the polymer base material, and the like.

As a method of preventing the occurrence of the thermolysis gas from the polymer base material, for example, a method for improving the resin components is proposed (see, for example, Japanese Patent Application Laid-Open No. 2000-35509). The resin composition described in Japanese Patent Application Laid-Open No. 2000-35509 prevents the occurrence of the pyrolysis gas of the polymer base material by reducing the amount of distal carboxyl group to the specified amount or less. However, the resin composition described in Japanese Patent Application Laid-Open No. 2000-35509 does not contain a mold release agent, thus mold release failure may occur when molding a large, complicated three-dimensional shaped molded article. As a method for improving such problem, a method for improving the mold release agent of resin component is proposed (see, for example, Japanese Patent Application Laid-Open No. 2005-97563).

As a structural body in which a metallic film is formed on a surface of a plastic molded article, there is an fθ mirror which is used for scanning an optical beam of a laser printer or a copying machine, and a large mirror which is used for deflecting an optical path of a projection television. In a method of producing such plastic mirrors, conventionally, a metallic reflection coating is formed by means of vapor deposition or the like on a surface of a molded article to which a high-precision mirror plane of a mold is transferred. Such a vapor deposition method requires an expensive deposition apparatus, thus the plant cost is high. Especially for a large-area molded article, only a small number of molded articles are obtained per one batch at the time of vapor deposition, leading to poor productivity.

In order to overcome the above problems, there is proposed a conventional method of creating a plastic mirror by attaching a metallic sheet to a mold surface with vacuum and simultaneously performing composite injection molding with thermoplastic resin, without carrying out the vapor deposition step (see, for example, Japanese Patent Application Laid-Open No. H5-315829). However, the method proposed in Japanese Patent Application Laid-Open No. H5-315829 has a problem that the reflectance of the metallic film becomes low. Moreover, in the method proposed in Japanese Patent Application Laid-Open No. H5-315829, since the metallic sheet needs to be bonded to the mold, it is difficult to make a tracing of a complicated shape of a mold with the metallic sheet.

Furthermore, there is proposed a method of obtaining high reflectance by using a metallic reflective film such as an aluminum or silver reflection coating on a resin film (transfer sheet) instead of on the metallic sheet (see, for example, Japanese Patent Application Laid-Open No. H3-82513). The method proposed in Japanese Patent Application Laid-Open No. H3-82513 can be performed easily as long as a flat molded article is used, but in the case of a complex molded article with curved surfaces, a tension may be applied to the film and thereby cracks may be caused on the metallic reflective film during the process where the metallic reflection coating is transformed to have curved surfaces when molding is performed. The reason of such occurrences is that the bonding strength of the metallic reflection coating formed on the resin film by means of vapor deposition is weaker than the bonding force of the resin film. Moreover, the method proposed in Japanese Patent Application Laid-Open No. H3-82513 has a problem that the metallic reflection coating is easily broken due to the influence of a flow of the molten resin since injection molding is performed to obtain an integrated molded article. It should be noted that in the method of producing the molded article which is described in Japanese Patent Application Laid-Open No. H3-82513 , the resin film (transfer sheet) is detached after molding is performed.

As a method of preventing the occurrence of the cracks on the metallic film, there is proposed a method of adhering a polymer base material on which a metallic film is formed by means of vapor deposition, to a polymer molded article, which is obtained by means of injection molding, by means of pressure bonding (see, for example, Japanese Patent Application Laid-Open No. 2004-148638). In the method disclosed in Japanese Patent Application Laid-Open No. 2004-148638, heating/pressure bonding is required in other step after the injection molding, thus mass productivity may be obstructed.

On the other hand, conventionally, as the method of forming a metallic film on a polymer surface at low cost, the electroless plating method are known as described above, but the polymer surface is required to be roughened by means of etching with chromic acid or the like, thus the applicable resin material is limited to ABS or the like which is immersed in the etching solution. In other material such as polycarbonate, a grade, in which ABS or elastomer is mixed so that electroless plating can be performed, is commercially available, but such material does not sufficiently satisfy the requirements of heat resistance and reflective performance.

Moreover, silver mirror reaction is conventionally known as a method of obtaining a high-reflectance metallic film by means of wet electroless plating method. Various reflectors or mirrors in which a silver thin film is formed on a glass by means of the above-mentioned method are widely used. However, application of such silver mirror reaction to a resin molded article having a high degree of freedom in the shape thereof has not been a trend. Also, as described above, the applied material for etching and the resin material which can fix the catalyst core are limited to ABS or the like, thus it is difficult to apply the silver mirror reaction to the resin material having high heat resistance. As a method of forming a reflection coating on a resin base material by silver mirror reaction, there is proposed a method of activating the surface by means of, for example, plasma processing, corona discharge processing or the like (see, for example, Japanese Patent Application Laid-Open No. 2000-73178). In the method disclosed in Japanese Patent Application Laid-Open No. 2000-73178, a transparent curing film made of acrylic resin or the like is required between the base material surface and the reflection coating, and a molded article with a silver reflection coating having a heat resistance of 150° C. or more is not proposed.

Furthermore, the inventors propose an injection molding method in which carbon dioxide of supercritical fluid or the like is used as a solvent to dissolve metallic fine particles of metal complexes in the carbon dioxide, and the metallic fine particles are impregnated in a mold cavity or the like at the time of injection molding to segregate the catalyst core of electroless plating to the surface (see, for example, Japanese Patent Application Laid-Open No. 2005-205898). According to the investigation performed by the inventors, only the metallic fine particles present in the vicinity of the surface of the molded article contribute as the catalyst core of electroless plating, and the metallic fine particles impregnated an inside of the molded article become the loss. Moreover, in the method disclosed in Japanese Patent Application Laid-Open No. 2005-205898, it is difficult to control the depth of penetration of the metallic fine particles and to impregnate the metallic fine particles evenly in the molded article surface because the surface viscosity of the resin is different at the time of dispersion in the mold.

SUMMARY OF THE INVENTION

Generally, in the above-mentioned conventional extrusion molding method, the surface modification processing and electroless plating processing for the molded article in the post-processes are usually troublesome. Furthermore, the materials to which the electroless plating processing can be applied are limited to some materials (ABS or the like), thus the electroless plating process is difficult to be applied to the resin materials such as the above-mentioned liquid crystal polymer or the like. It is difficult to roughen the surface of the liquid crystal polymer by means of etching solution because the liquid crystal polymer is chemically stable, and there is a problem that it is difficult to form an electroless plating film on the liquid crystal polymer by the conventional electroless plating process.

In the electroless plating method proposed in "Latest Applied Technology of Supercritical Fluid", the supercritical carbon dioxide in which metal complexes are dissolved is used to perform batch treatment for the polymer in a high pressure container, thus there is a problem that it is difficult to perform continues processing. When the inventors investigated the electroless plating method proposed in "Latest Applied Technology of Supercritical Fluid", it was found that the processing time has increased and that the rate of reduction of the metal complexes was low.

The present invention is contrived to solve the above problems, and a first object of the present invention is to provide a molded article production method in which continuous processing can be performed and modifying materials such as metal complexes can be impregnated effectively in a thermoplastic resin for a short period of time.

A second object of the present invention is to provide an extruder capable of continuously producing molded articles such as thermoplastic resin film, sheet and pipe which can be subjected to electroless plating.

A third object of the present invention is to provide a method of producing a thermoplastic resin molded article and a molded article, which can be subjected to an electroless plating process without roughening of a surface of the molded article.

The above-mentioned conventional method of forming a metallic film on a surface of a resin molded article does not propose a method in which a dry process such as vapor deposition process is not required and low price and mass production can be achieved, and with which both durability and high reflectance properties can be obtained in applications of a head lamp reflector for an automobile in which durability (high heat resistance) is particularly required, and in applications of a mirror of an optical component in which high reflectance properties is required. Further, it was more difficult to form a metallic film of high quality on a large-area molded article having a complicated shape.

Therefore, a fourth object of the present invention is to solve the above problem and to provide a inexpensive method having high versatility for producing a molded article in which a metallic film with high reliability and reflectance properties has been formed on the molded article. Moreover, a fifth object of the present invention is to obtain a resin molded article in which at least a part of a surface thereof is made highly functional by a modifying material.

A sixth object of the present invention is to provide a molded article in which the amount of penetration and the depth of penetration of the modifying material such as metallic fine particles are controlled evenly, and to provide a method of producing such molded article.

According to a first aspect of the present invention, there is provided a method of producing a molded article, comprising:

impregnating a high-pressure fluid containing a modifying material, in a thermoplastic resin; and continuously molding the thermoplastic resin in which the modifying material has been impregnated, into a form of a film.

In the present specification, the high-pressure fluid includes not only a supercritical fluid but also a high-pressure liquid fluid (liquid) and a high-pressure gas such as a high-pressure inert gas.

According to the investigation performed by the inventors, in the batch treatment in the electroless plating method proposed in "Latest Applied Technology of Supercritical Fluid", it takes at least approximately 10 minutes to several ten minutes for the metal complexes dissolved in the supercritical fluid to be impregnated in the polymer (molded article) so that electroless plating can be performed sufficiently. It should be noted in the electroless plating method proposed in "Latest Applied Technology of Supercritical Fluid" that although the polymer having a solidified surface is softened when the polymer is brought into contact with the supercritical fluid, a step of impregnating the metal complexes is performed after the polymer surface is softened, thus this step is also a cause of the increased processing time.

Furthermore, in the electroless plating method proposed in "Latest Applied Technology of Supercritical Fluid", it was found that the amount of penetration of the metallic fine particles on the surface of the polymer (molded article) was 2 to 3 at % (atomic percent) at most, and the rate of reduction of the metal complexes impregnated in the polymer was not more than 50 to 60%, thus the material loss in the expensive metal complexes was large. The low processing temperature is considered as one of the causes of such problem. In order to reduce the metal complex to metallic fine particles which are the catalyst cores for electroless plating, conditions such as high temperature and high pressure are required. However, when the processing temperature is not less than the glass-transition temperature or melting point of the polymer, the polymer is transformed significantly, thus it is difficult to perform the reduction processing under the conditions of high temperature and high pressure. Therefore, in the electroless plating method proposed in "Latest Applied Technology of Supercritical Fluid", since it is inevitable to perform the reduction processing at low temperature, it is considered that the rate of reduction of the metal complexes decrease.

Therefore, as a result of the committed investigation on the method of impregnating the modifying material in the thermoplastic resin by using the supercritical fluid or the like, the inventors have found a method of injecting a high-pressure fluid containing a modifying material into molten resin inside an extruder so that the modifying material is effectively impregnated in the thermoplastic resin for a short period of time. Moreover, in the production method according to the first aspect of the present invention, since the high-pressure fluid in which the modifying material is dissolved is injected into the molten resin inside the extruder, modification of the surface and the inside of the thermoplastic resin can be performed simultaneously with molding processing.

In the production method according to the first aspect of the present invention, an extruder having a heating cylinder and an extruding die may be used for the method, and when the high-pressure fluid is impregnated in the thermoplastic resin, the high-pressure fluid may be impregnated in the thermoplastic resin within a region spanning from the heating cylinder to the extruding die of the extruder. In the production method according to the first aspect of the present invention, the high-pressure fluid may be impregnated in the thermoplastic resin inside the extruding die.

The position where the high-pressure fluid having the modifying material dissolved therein is injected, can be any position of the region spanning from the heating cylinder to the extruding die inside the extruder. For example, the high-pressure fluid and the modifying material dissolved therein may be impregnated not only in the heating cylinder but also in a section connecting the heating cylinder to the extruding die, or in the extruding die. When the high-pressure fluid in which the modifying material is dissolved is impregnated in a resin surface from a part of a die surface during the process of pressing and spreading the molten resin by the extruding die to form a film, the modifying material can be impregnated only in the surface of a resin molded article, thus a resin molded article in which only the surface is modified can be obtained. Accordingly, in this case, the used amount of the modifying material can be decreased for the resin molded article in which the inside of the molded article does not have to be modified. Moreover, the amount of penetration of the high-pressure fluid in the resin can be decreased, thus when it is necessary to prevent foams to be created in the resin molded article, such control can be performed easily.

Examples of the high-pressure fluid which can be used in the molded article production method of the present invention include air, CO, $CO_2$, $O_2$, $N_2$, $H_2O$, methane, ethane, propane, butane, pentane, hexane, methanol, ethyl alcohol, acetone, diethyl ether, and the like. Above all, carbon dioxide in a supercritical state (also referred to as "supercritical carbon dioxide" hereinafter) or high-pressure carbon dioxide is particularly preferred. The critical temperature of $N_2$ is $-147°$ C. and the critical pressure of same is 34 atm. The critical temperature of $H_2O$ is $374°$ C. and the critical pressure of same is 218 atm. On the contrary, the critical temperature of the supercritical carbon dioxide is $31°$ C. and the critical pressure of same is 73 atm. Moreover, carbon dioxide has the solubility equivalent to that of n-hexane, acts as a plasticizer on the thermoplastic resin material, and thus has a great performance in injection molding or extrusion molding. In view of such factors, the supercritical carbon dioxide, liquid high-pressure carbon dioxide or high-pressure carbon dioxide gas is desired as a medium for dissolving the modifying material. It should be noted that one type of each of the high-pressure fluid may be used independently or two more types thereof may be mixed. Moreover, in order to improve the solubility of the modifying material in the high-pressure fluid, various types of alcohol or acetone may be mixed with the high-pressure fluid as an assisting solvent (entrainer).

As the modifying material which can be used in the present invention, any material may be used as long as it is a material which is dissolved in the high-pressure fluid to some extent. For example, when hydrophobic dye is used as the modifying material, the resin molded article can be dyed. Further, by impregnating several types of dyes having different colors in thermoplastic resin in a molten state or in a semi-molten state along with the high-pressure fluid, the resin molded article can be dyed with a special color obtained by blending these different colors of dyes.

When a flame-resistance material (for example, a flame retardant of phosphoric acid system such as ammonium polyphosphate, organic metal complex, or the like) is used as the modifying material, the flame-resistance of the resin molded article can be improved. By using a low-molecular-weight organic material containing inorganic material such as ceramic or $SiO_2$, e.g. metallic alkoxide, as the modifying material, the inorganic material such as ceramic or $SiO_2$ can be impregnated in the molded article, whereby heat expansion coefficient or water absorption of the resin molded article can be reduced.

Further, when nano-carbon such as carbon nanotube in which nitro group or the like is chemically modified and solubilized in the high-pressure fluid is used as the modifying material, a resin molded article with high conductivity and high strength can be obtained.

When surfactant such as block copolymer of polyethylene oxide-polypropylene oxide and glycerine fatty acid ester, or polymer or monomer having hydroxyl group or amide group such as polyalkyl glycol, acrylamide, ε-caprolactam or the like is used as the modifying material, a hydrophilic resin molded article can be obtained (wet properties can be added). On the other hand, when a hydrophobic material such as silicone oil is used as the modifying material, the resin molded material can be hydrophobized.

In addition, an inorganic material may be used as the modifying material. Especially when metallic fine particles of metal complexes, metallic alkoxide or the like are used, electrical conductivity and thermal conductivity can be added to the resin molded article. When inorganic fine particles of $SiO_2$ or the like are used as the modifying material, the heat expansion coefficient of the resin molded article can be constrained and the refractive index of same can be controlled. However, when these inorganic materials are used as the modifying material, it is desired that chemical or physical modification be performed so that the modifying material is dissolved easily in the high-pressure fluid. By dissolving these metallic fine particles, which are not very compatible with resin, in the high-pressure fluid and bringing them into contact with the resin, diffusibility and compatibility of the high-pressure fluid in the resin can be used. Accordingly, the metallic fine particles can be dispersed evenly in the resin or a resin surface.

When a metal complex containing a metallic element is used as the modifying material and the metal complex is impregnated in the molten resin together with the high-pressure fluid, the metal complex is subjected to thermic reduction in the high-temperature molten resin to convert into metallic fine particles. As a result, a resin molded article having a surface with the impregnated (deposited) metallic fine particles are obtained. Particularly, when the metallic fine particles are catalyst cores for plating, a resin molded article which can be subjected to electroless plating can be obtained. In this case, without roughening a surface of the resin molded article by means of etching as with the prior art, a resin molded article which can be subjected to an electroless plating process can be obtained. In this case, electroless plating can be performed easily on a conventional resin material such as liquid crystal polymer on which it was difficult to perform electroless plating.

As the metal complex which may be used in the molded article production method of the present invention, any material may be used as long as it has a certain degree of solubility in the high-pressure fluid. For example, bis(cyclopentadienyl)nickel, bis(acetylacetonate)palladium (II), dimethyl(cyclooctadienyl)platinum (II), hexafluoro acetylacetonate palladium (II), hexafluoro acetylacetonate hydrate copper (II), hexafluoro acetylacetonate platinum (II), hexafluoro acetylacetonate(trimethyl phosphine)silver (I), dimethyl(heptafluoro octa nedionate)silver (AgFOD), or the like may be used as the modifying material.

As the thermoplastic resin material which may be used in the molded article production method of the present invention, any material may be used as long as extrusion molding can be carried out. For example, polyolefin such as low-density polyethylene, high-density polyethylene, polypropylene and poly-4-methylpentene-1, polyvinyl such as polyvinyl chloride, polyvinyl alcohol and polyacrylonitrile and polyether such as polyoxymethylene, and polyethylene oxide may be used. As other materials, high polymer materials such as polyester, polyamide, polyimide, polymethyl methacrylate, polysulfone, polycarbonate, and polylactic acid may be used. Moreover, aromatic polyester such as polyethylene terephthalate, aromatic amide such as polyamide terephthalate, and fluorinated polymer such as poly tetra fluoro ethylene may also be used. Moreover, the resin material may contain a filler such as glass fiber, carbon fiber, inorganic compound, and ceramic.

According to a second aspect of the present invention, there is provided a method of producing a molded article, comprising:

melting a thermoplastic resin;

preparing a high-pressure fluid containing a modifying material;

bringing the high-pressure fluid into contact with the thermoplastic resin which has been molten to impregnate the modifying material into the thermoplastic resin; and continuously molding the thermoplastic resin in which the modifying material has been impregnated, into a form of a film.

In the production method according to the second aspect of the present invention, an extruder having a heating cylinder and an extruding die may be used for the method, and when the high-pressure fluid is impregnated in the thermoplastic resin, the high-pressure fluid may be impregnated in the thermoplastic resin within a region spanning from the heating cylinder to the extruding die of the extruder.

In the production method according to the second aspect of the present invention, the modifying material may be a metal complex.

In the production method according to the second aspect of the present invention, when the high-pressure fluid is impregnated in the thermoplastic resin, the metal complex impregnated in the thermoplastic resin may be subjected to thermic reduction to transform into metallic fine particles so that the metallic fine particles may be deposited on a surface of the thermoplastic resin. In the production method according to the second aspect of the present invention, the metallic fine particles may be plating catalyst cores.

The molded article production method of the present invention may further comprise performing an insert molding with an injection molding apparatus having a mold, wherein the performing of the insert molding includes: holding the thermoplastic resin molded into the form of the film inside a cavity of the mold of the injection molding apparatus; and injecting a molten resin in the injection molding apparatus into the cavity in which the thermoplastic resin molded into the form of the film is held.

In the molded article production method of the present invention, the highly functional thermoplastic resin film (also referred to as "resin film" hereinafter), in which the modifying material has been impregnated on a surface or an inside thereof, is subjected to insert molding (in mold) by the production method according to the first or second aspect of the present invention, whereby the resin film and an injection-molded resin base material may be integrated to produce the injection-molded article which has been partially highly-functioned (this production method is also referred to as a "production method using insert molding"). In this case as well, a highly functional resin film having the modifying material impregnated therein is produced by the production method according to the first or second aspect of the present invention, thus the modifying material can be continuously and stably dispersed on the surface or in the inside of the resin by an extruding screw or the like, and the depth of penetration and/or the amount of penetration of the modifying material can be controlled easily. Moreover, in the production method using insert molding according to the present invention, by appropriately adjusting the thickness of the resin film in which the modifying material has been impregnated, the thickness of penetration of the modifying material in the resin molded article after insert molding can be controlled.

Further, in the production method using insert molding according to the present invention, when molding the resin film by extrusion molding or the like, the metal complex is impregnated in the molten resin, the impregnated metal complex is reduced by the heat or the like, which is generated when the metal complex is brought into contact with the molten resin, then converted into metallic fine particles, and thereafter deposited on a surface of the resin film. Accordingly, in this case, as with the production method according to the first or second aspect of the present invention, this production method can be also applied to a resin material in which the surface is not roughened using the conventional etching method, and to which a catalyst core for a plating film is difficult to be fixed. It should be noted that in the resin film which is produced in the production method using insert molding according to the present invention, metallic fine particles which do not contribute as the catalyst core also exist sometimes, but the material loss can be prevented by thinning the resin film. Moreover, the strength of the resin molded article, which is produced by the production method using insert molding according to the present invention, can be maintained by the resin base material of the resin film which is molded at the time of insert molding. In the resin molded article which is produced by the production method using insert molding according to the present invention, since the resin film impregnated with the metallic fine particles is integrated by the insert molding with the resin base material (molded article main body) which does not have the metallic fine particles impregnated therein, thus the existential rate of metallic fine particles in the entire molded article can be reduced and the cost of a single piece of molded article can also be reduced.

As the modifying material which may be used in the production method using insert molding according to the present invention, any material may be used as long as it is dissolved in the high-pressure fluid. Specifically, the same materials as those described in the production methods according to the first and second aspects (method of producing a film-shaped molded article) of the present invention may be used. For example, as the modifying material, by using a known various types of dyes which can be dissolved in the high-pressure fluid, a molded article in which only the resin film (partially) is dyed can be obtained. Further, when surfactant such as glycerine fatty acid ester, block copolymer of polyethylene oxide-polypropylen oxide, octaethylen glycol monododecyl ether or the like, or polymer or monomer having hydroxyl group or amide group such as polyalkyl glycol, acrylamide, ε-caprolactam or the like is used as the modifying material, the wet properties of only the surface of the resin film of the resin molded article can be improved. When a fluorine compound, silicone oil or the like is used as the modifying material, water shedding quality can be added only to the surface of the resin film of the resin molded article.

In the production method using insert molding according to the present invention, when the metallic fine particles, which are the catalyst cores for electroless plating, is used as the modifying material which is dissolved in the high-pressure fluid, a molded article can be produced in which the resin film, which has the catalyst core for electroless plating dispersed on a surface thereof, is integrated with a surface of the resin base material. Namely, a resin molded article in which the catalyst core for electroless plating is dispersed only in the surface of the resin film can be produced. It should be noted that the type of the applicable metallic fine particles can be arbitrarily selected in accordance with the electroless plating film or costs, thus platinum, nickel, palladium, copper or the like can be used. In this case, an electroless-plated metallic film can be formed directly on the surface of the molded article obtained immediately after insert molding is performed. In electroless plating, the conventional electroless plating solution and plating process can be employed.

Regarding the state of dispersion of the metallic fine particles inside the resin film containing the metallic fine particles, it is enough that an amount of the metallic fine particles acting as the catalyst core for electroless plating may be dispersed on the surface of the resin sheet, or may be dispersed not only on the surface but also inside of the film. It should be noted that the dispersion amount of the metallic fine particles dispersed on the surface of the resin film, which is required to act as the catalyst core for electroless plating, is preferably in a range of 0.1 to 10 at % (atomic percent) in the element ratio. When the amount of the metallic fine particles dispersed on the surface of the resin film is less than 0.1 at %, it is difficult to form an electroless plating film having good adhesion properties. When, on the other hand, the amount of the metallic fine particles dispersed on the surface of the resin film is larger than 10 at %, a metallic luster is obtained to the extent that electroless plating processing is not required. However, in the molded article production method of the present invention, the metallic fine particles are obtained using expensive metal complexes or the like, thus in the case of that the amount of dispersed metallic fine particles is larger than 10 at %, it may be uneconomical. It should be noted that the ratio of each element in the surface of the resin film can be analyzed by XPS.

In the production method using insert molding according to the present invention, the modifying material may be formed of metallic fine particles and the method may further comprise forming a metallic film on the thermoplastic resin molded into the form of the film by electroless plating after the insert molding is performed. In the production method using insert molding according to the present invention, especially, the metallic film may be formed by a silver mirror reaction. As the type of the electroless plating method which is used in the production method using insert molding according to the present invention, a nickel plating process, a copper plating process or the like may be used as with the prior art. Alternatively, a silver mirror reaction may also be used. Particularly, when a silver plated film is formed on the surface of the resin molded article by the silver mirror reaction, a high-reflectance metallic film can be formed on an resin which is difficult to be plated such as transparent resin or a high-heat resistant resin. In this case, for example, a large-area reflector or the like can be produced at low cost.

Further, in the production method using insert molding according to the present invention, when a silver reflection coating is formed on the surface of the resin base material, any organic or inorganic protective film may be formed on the silver reflection coating in order to protect the silver reflection coating. For example, when an electroless plating film such as a copper plating film or nickel plating film may be formed as a protective film on the silver film, and the resin film and the molded article base material (the resin base material which is injection-molded at the time of insert molding) are formed of a transparent material, a resin molded article to which light is reflected at high reflectance via the resin film and molded article base material can be produced. Furthermore, an organic-inorganic hybrid material which can be formed at low temperature, ultraviolet curable resin or the like may be coated as the protective film on the silver reflection coating.

In the molded article production method of the present invention, the metallic compound such as metal complex, which is dissolved in the high-pressure fluid, may be reduced by heat of the molten resin or the like to metalize, after impregnating the metallic compound in the resin surface, as described above. The reason is because the metallic compound itself hardly functions as the catalyst core for electroless plating by reason that organic substances are coordinated in the metallic compound such as the metal complex. The present invention is not limited to this configuration, thus after the resin film is molded, the metal complexes may be reduced to metallic fine particles by a chemical reduce or the like. In addition, for example, alcohol such as ethanol, propanol or the like may be used as a reducer which is dissolved in the high-pressure fluid (inert gas). It should be noted that the metallic fine particles described in the present specification includes a metallic compound containing a metallic element.

In the molded article production method of the present invention, the high-pressure fluid may be discharged during extrusion molding processing, after the modifying material, which is dissolved in the high-pressure fluid, is impregnated in at least a surface of the molten resin together with the high-pressure fluid. In this case, low-molecular components such as oligomers of the resin material and a mold release agent may be dissolved in the high-pressure fluid and these low-molecular components may be extracted and removed from the resin material. As a result, the components which easily vaporize under a high-temperature environment can be further reduced in the resin film, thus the improvement of weatherability of the plating film obtained after electroless plating processing can be expected.

According to a third aspect of the present invention, there is provided an extruder, comprising:
    a heating cylinder which melts a thermoplastic resin;
    an extruding die; and an injection apparatus which impregnates a high-pressure fluid containing a modifying material into the thermoplastic resin which has been molten. According to the extruder of the present invention, a film, sheet, pipe or the like made of thermoplastic resin, on which electroless plating can be performed, can be continuously produced.

In the extruder of the present invention, the injection apparatus may be provided in a region spanning from the heating cylinder to the extruding die.

The extruder of the present invention may further comprise a dissolver which prepares the high-pressure fluid containing the modifying material. It should be noted that the present invention is not limited to this aspect. For example, a storage container such as a bomb in which the high-pressure fluid having a modifying material dissolved therein in advance, is filled may be prepared, and the high-pressure fluid in which the modifying material is dissolved may be directly introduced to the inside of the extruder from such storage container.

According to a fourth aspect of the present invention, there is provided a molded article, comprising:

a molded article body which is formed of thermoplastic resin and is molded by extrusion molding; and a metallic conductive film provided on the molded article body, wherein metallic fine particles are impregnated in a surface on a side of the metallic conductive film of the molded article body.

According to a fifth aspect of the present invention, there is provided a molded article, comprising:

a molded article body made of thermoplastic resin;

a metallic conductive film provided on the molded article body; and a thermoplastic resin film provided between the molded article body and the metallic conductive film, wherein metallic fine particles are impregnated in a surface on a side of the metallic conductive film of the thermoplastic resin film.

In the molded article of the present invention, the metallic conductive film may be a metallic film formed with an electroless plating process. Particularly, in the molded article of the present invention, the metallic conductive film may be a silver reflection coating formed by a silver mirror reaction.

According to the method of producing a molded article and the extruder of the present invention, the high-pressure fluid in which a modifying material is dissolved is injected into the molten resin inside an apparatus such as the extruder, thus modification of a surface and the inside of the thermoplastic resin can be performed simultaneously with molding processing, and further the modifying material can be effectively impregnated in the thermoplastic resin for a short period of time. According to the molded article production method and the extruder of the present invention, a film-shaped resin molded article in which the surface or the inside thereof has been modified can be continuously produced. Therefore, according to the molded article production method and the extruder of the present invention, when a metal complex is used as the modifying material, a film-shaped resin molded article, in which a catalyst core (metallic fine particle) for electroless plating has been impregnated in a surface thereof, can be produced at low cost.

In the molded article production method of the present invention, the high-pressure fluid in which metal complexes have been dissolved can be impregnated in the molten resin, and a film-shaped resin molded article, in which a catalyst core (metallic fine particle) for electroless plating has been impregnated in a surface thereof, can be molded. Therefore, according to the molded article production method of the present invention, a resin molded article, which has metallic fine particles impregnated in a surface thereof and on which electroless plating can be performed, can be produced for a resin material to which application of electroless plating was difficult heretofore.

Moreover, according to the production method using insert molding of the present invention, by controlling the thickness or the like of the resin film in which the modifying material such as metallic fine particle has been impregnated, the amount of penetration or the depth of the penetration of the modifying material in the resin molded article can be evenly controlled.

According to the production method using insert molding of the present invention, a resin molded article having various functionalities on a surface thereof can be provided. Particularly, the resin molded articles having a high-quality reflection coating can be massively produced without carrying out an expensive dry process.

BRIEF DESCRIPTION OF THE DRAWINGS

FIG. 6 is a schematic cross-sectional diagram of a resin molded article obtained after extrusion molding in Embodiment 4 is performed;

FIG. 7 is a schematic cross-sectional diagram of a resin molded article obtained after metallic film formation in Embodiment 4 is performed;

FIG. 8 is a schematic cross-sectional diagram of a resin molded article obtained after protective film formation in Embodiment 4 is performed;

FIG. 9 is an enlarged schematic cross-sectional diagram showing the vicinity of a resin film of the resin molded article which was produced in Embodiment 4;

FIG. 11 is a flow chart showing the procedure of a method of producing of a molded article of Embodiment 1;

FIG. 12 is a flow chart showing the procedure of a method of producing of a molded article of Embodiment 4; and FIG. 13 is a flow chart showing the procedure of a method of producing of a molded article of Embodiment 5.

DESCRIPTION OF THE PREFERRED EMBODIMENTS

Hereinafter, embodiments of the method of producing a resin molded article, the extruder, and the thermoplastic resin molded article according to the present invention are described specifically with reference to the drawings, but the present invention is not limited to these embodiments.

Embodiment 1

Embodiment 1 describes a method of impregnating a supercritical fluid (a high-pressure fluid), in which metal complexes (modifying material) have been dissolved, in a molten resin inside an extruder, to produce a thermoplastic resin film (also referred to as "resin film" hereinafter). In addition, in this embodiment, polycarbonate was used as the thermoplastic resin. As the metal complex containing a metallic element, dimethyl(heptafluoro octa nedionate) silver (silver complex: AgFOD) was used. Moreover, a carbon dioxide in a supercritical state was used as the supercritical fluid (also referred to as "supercritical carbon dioxide" hereinafter). It should be noted that the resin film produced in this embodiment can be used as a resin molded article having antibacterial effectiveness.

Extruder

Figure 1:
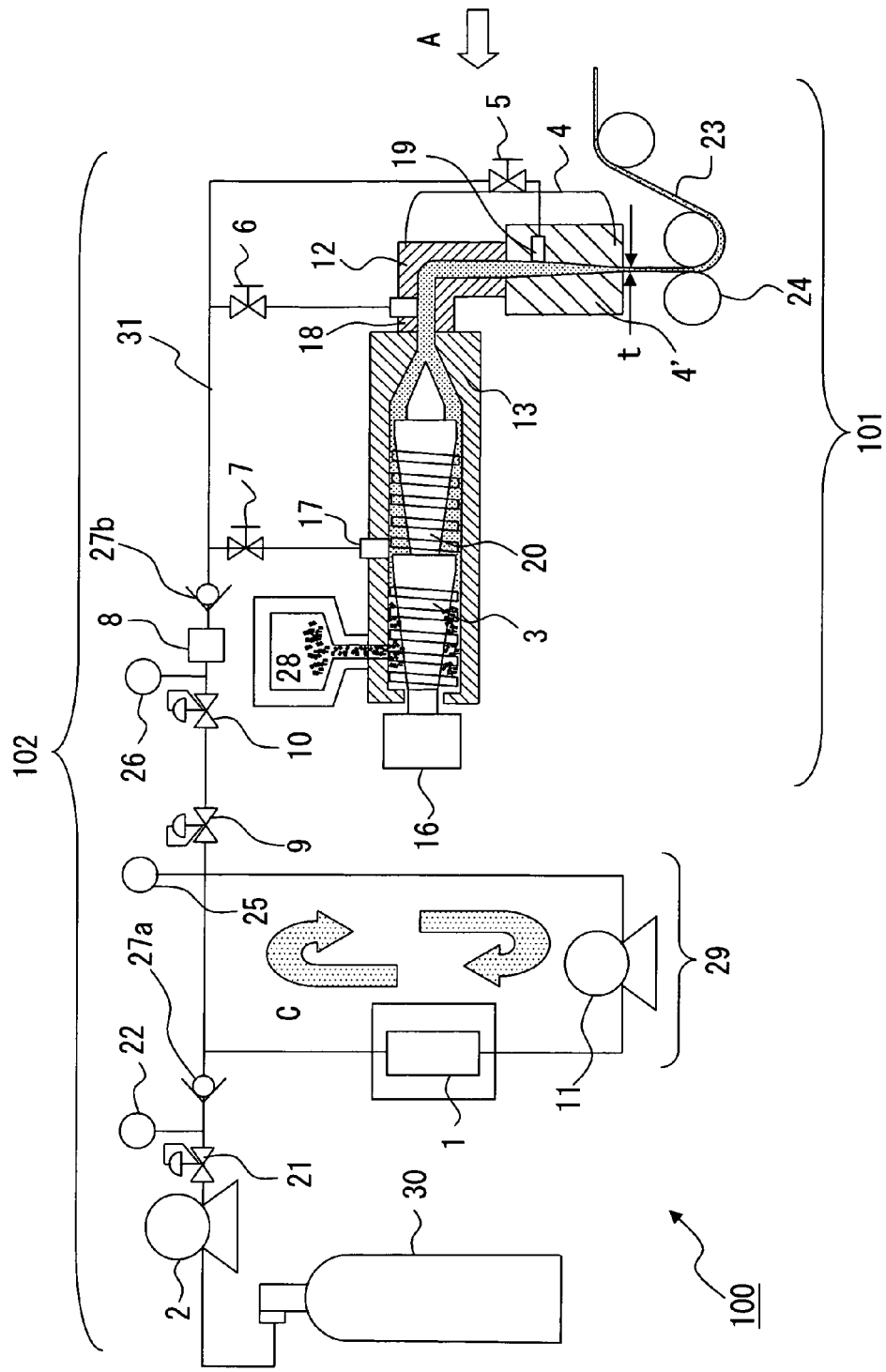
FIG. 1 is a schematic configuration diagram of an extruder which is used in a molding method of Embodiment 1.
Figure 2:
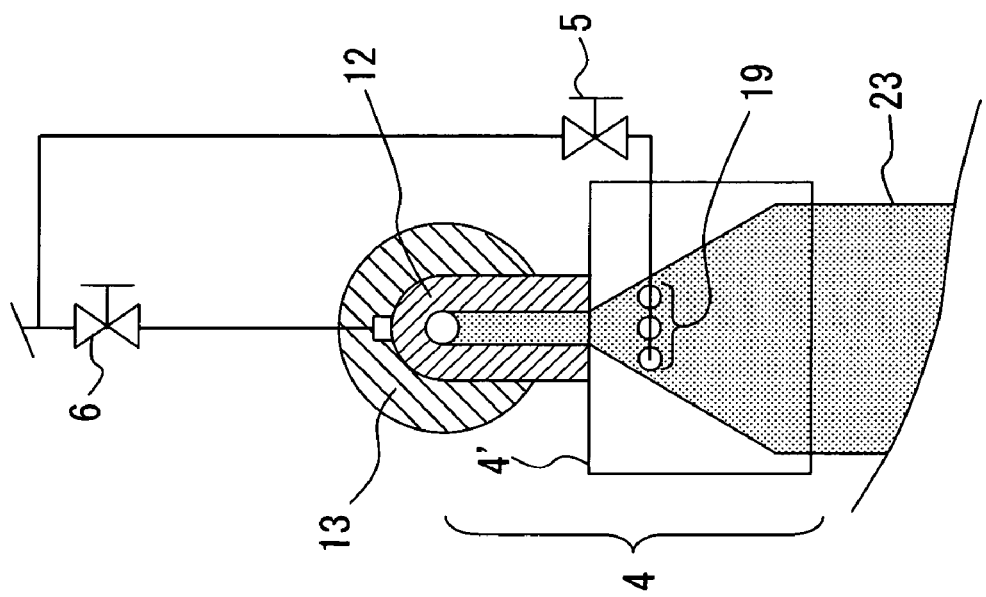
FIG. 2 is a schematic diagram showing the vicinity of a die which is viewed from a direction of the arrow A in FIG. 1.

First, the extruder which is used in this embodiment is explained. FIG. 1 shows a schematic configuration diagram of the extruder used in this embodiment. FIG. 2 is a schematic diagram showing the vicinity of an extruding die 4 of the extruder 100, which is viewed from a direction of the arrow A in FIG. 1.

As shown in FIG. 1, the extruder 100 which is used in this embodiment mainly includes an extruding section 101 and a carbon dioxide supply section 102.

As shown in FIG. 1, the extruding section 101 mainly includes a plasticizing/melting cylinder 13 (also referred to as "heating cylinder" hereinafter), a hopper 28 which supplies a resin pellet into the heating cylinder 13, a motor 16 which rotates a screw 3 inside the heating cylinder 13, a die 4 which reduces the thickness of a molten resin and extrudes the molten resin while expanding it in a fan-like form, and a cooling roll 24. In addition, for the screw 3 in this embodiment, a uniaxial screw 3 having a vent structure section 20 functioning as a pressure-reducing section was used.

The structure/system of the extruding die 4 is arbitrary and thus can be selected appropriately according to the shape and application of a molded article to be produced. However, in this embodiment a T die for molding a film was used as the extruding die 4. Further, as shown in FIG. 1, the T die 4 includes a flat die 4' and a joint section 12 which connects the flat die 4' to the heating cylinder 13. In the extruder 100 of this embodiment, a resin film 23 which is extruded by the T die 4 is reeled by the cooling roll 24 or the like. In the present embodiment, a gap t at a die extruding port of the T die 4 was set to 1.0 mm.

Moreover, in the extruder 100 of this embodiment, three injection ports for the supercritical carbon dioxide are provided and an injector valve is provided at each injection port. The first injector valve is, as shown in FIG. 1, an injector valve 17 provided in the vicinity of the vent structure section 20 of the uniaxial screw 3 in which molten resin is depressurized. The second injector valve is an injector valve 18 provided in the joint section 12, and the third injector valve is an injector valve 19 provided in the flat die 4'. In addition, the supercritical fluid introducing section of each of the injector valves 17, 18 and 19 has a pressure sensor (not shown) for measuring the internal pressure of the resin.

As shown in FIG. 1, the carbon dioxide supply section 102 mainly includes a carbon dioxide bomb 30, a compression pump 2, a dissolver 1, a circulating pump 11, a flowmeter 8, two pressure-reducing valves 21, 10, two check valves 27a, 27b, a backpressure valve 9, three stop valves 5, 6, 7, three pressure gauges 22, 25, 26, and a pipe 31 which connects these components. The output sides (secondary sides) of the stop valves 5, 6, 7 are connected to the injector valves 19, 18, 17 of the extruding section 101 respectively via the pipe 31 and communicated to flow paths of the molten resin inside the extruding section 101, as shown in FIG. 1. Furthermore, as shown in FIG. 1, the carbon dioxide supply section 102 of this embodiment has a circulating path 29 in which the supercritical carbon dioxide containing a modifying material is prepared.

It should be noted that in the extruder 100 of the present embodiment, the same constructions as the mechanisms of a known extruder can be used in the mechanisms of the screw 3, heating cylinder 13, die 4 and the like.

Method of Producing a Resin Film

Next, a method of producing a resin film (molding method) of the present embodiment is described with reference to FIGS. 1 and 11. First, a sufficient amount of the pellet formed of the resin material (polycarbonate) was supplied to the hopper 28 of the extruding section 101, and the resin material was plasticized and molten by the rotation of the motor 16 (step S1 in FIG. 11). The number of revolutions of the screw 3 was 100 rpm, and the average set temperature of the heating cylinder 13 was 280° C. Next, the supercritical carbon dioxide (high-pressure fluid) was caused to flow in the dissolver 1 in which the modifying material was placed (inserted) in advance, thereby dissolving the modifying material in the supercritical carbon dioxide (step S2 in FIG. 11). Specifically, the modifying material was dissolved in the supercritical carbon dioxide in the manner described below. It should be noted that the method of dissolving the modifying material in the supercritical carbon dioxide in the present embodiment is not limited to the method described hereinafter. For example, a storage container such as a bomb may be used in which is filled a supercritical carbon dioxide having a modifying material dissolved therein in advance.

First, the pressure of liquid carbon dioxide which was supplied from the carbon dioxide bomb 30 was raised by the compression pump 2, and the pressure was adjusted by means of the pressure-reducing valve 21 so that the pressure gauge 22 shows 17 MPa. Next, the temperature of the pressurized carbon dioxide was raised to 40° C. by an unshown heat-regulating tank to bring the carbon dioxide to a supercritical state (supercritical carbon dioxide was generated). Thereafter, the supercritical carbon dioxide flowed to the circulating path 29 including the dissolver 1 via the check valve 27a. In this case, the supercritical carbon dioxide flows in the dissolver 1 and dissolves the modifying material (metal complex) placed in the dissolver 1.

The pressure inside the pipe and dissolver 1 of the circulating path 29 is adjusted by the backpressure valve 9 controlling upstream (primary side) pressure, so that the pressure gauge 25 shows 15 MPa. In addition, the temperature inside the dissolver 1 is controlled to 40° C. Then, in the circulating path 29, the circulating pump 11 of double plunger type is used to circulate the supercritical carbon dioxide in which the modifying material has been dissolved, in a direction of the arrow C in FIG. 1 at a constant pressure of 15 MPa without generating differential pressure. In addition, in the dissolver 1 sufficient amount of the modifying material, which is dissolved in the supercritical carbon dioxide, is placed so that it is supersaturated. The modifying material circulates in the circulating path 29 always in a saturated state, while being dissolved in the supercritical carbon dioxide.

Downstream pressure in the backpressure valve 9 is adjusted by the pressure-reducing valve 10 so that the pressure gauge 26 shows 13 MPa. The flow speed of the supercritical carbon dioxide in the circulating path 29, which is controlled by the circulating pump 11, adjusts the flow rate of the supercritical carbon dioxide which flow out of the circulating path 29 via the backpressure valve 9. For example, when the flow speed controlled by the circulating pump 11 increases, the flow rate of the supercritical carbon dioxide flowing to the pressure-reducing valve 10 side decreases. Further, by the supercritical carbon dioxide flowing out toward the pressure-reducing valve 10 and the heating cylinder 13, the reduced volume of the supercritical carbon dioxide inside the circulating path 29 is constantly supplied with the supercritical carbon dioxide from the upstream pressure-reducing valve 21 of the circulating path 29. Therefore, the pressure of the supercritical carbon dioxide in the circulating path 29 is held constant, and the supercritical carbon dioxide and modifying material dissolved therein circulate in the circulating path 29 at a constant flow rate.

Next, the flow rate of the supercritical carbon dioxide dissolving the modifying material was adjusted by means of the flowmeter 8 provided at a downstream of the pressure gauge 26, and the supercritical carbon dioxide having the modifying material dissolved therein was passed the check valve 27b. Then, the stop valve 7 was opened, the supercritical carbon dioxide dissolving the modifying material was introduced from the injector valve 17 to the vent structure section 20 of the uniaxial screw 3 inside the heating cylinder 13, and the modifying material was impregnated in the molten resin inside the heating cylinder 13, together with the supercritical carbon dioxide (step S3 in FIG. 11). It should be noted that this embodiment described an example in which the supercritical carbon dioxide dissolving the modifying material is introduced via the injector valve 17 provided in the heating cylinder 13, but the supercritical carbon dioxide dissolving the modifying material may be introduced from the injector valve 18 provided in the joint section 12 or from the injector valve 19 provided in the flat die 4'.

The pressure of the supercritical carbon dioxide which is introduced into the heating cylinder 13 was adjusted to be higher than the internal pressure of the resin, which was measured by the pressure sensor provided in the supercritical fluid introducing section of the injector valve 17. Namely, when the supercritical carbon dioxide was introduced into the heating cylinder 13, the pressure of the supercritical carbon dioxide was adjusted so that the value of the pressure displayed by the pressure gauge 26 in FIG. 1 became higher than the internal pressure of the resin, which was measured by the pressure sensor provided in the supercritical fluid introducing section. To be concrete, in this embodiment, the internal pressure of the resin in a plasticized/molten state was reduced to approximately 10 MPa in the vent structure section 20. Next, the flow speed of the supercritical carbon dioxide having the pressure of 13 MPa and having the modifying material dissolved therein was adjusted to 10 ml/min by the flowmeter 8. The supercritical carbon dioxide and the modifying material were then continuously introduced to and impregnated in the molten resin of the vent structure section 20 via the injector valve 17.

In this embodiment, the modifying material and the supercritical carbon dioxide were impregnated in the molten resin inside the heating cylinder 13 as described above. Therefore, according to the molding method and the extruder 100 of the present embodiment, the supercritical carbon dioxide, which has the modifying material dissolved therein in an appropriate amount with which the modifying material is not supersaturated, can be continuously and effectively injected to and can be impregnated in the resin, at an optimum pressure and flow rate.

In the molding method of the present embodiment, when the supercritical carbon dioxide and the modifying material dissolved therein are introduced into the heating cylinder 13, a silver complex, which is the modifying material, is brought into contact with high-temperature molten resin and sheared by the uniaxial screw 3, whereby the silver complex is decomposed and reduced, and silver fine particles are deposited. Namely, in the production method according to the present embodiment, at the point of time when the supercritical carbon dioxide having the modifying material dissolved therein is impregnated in the thermoplastic resin in a molten or semi-molten state, the metal complex (silver complex) is reduced to the metallic fine particles (silver particle). Therefore, in the production method of the present embodiment, a process for reducing the metal complex is not required separately.

Next, the molten resin which was extruded by the heating cylinder 13 was caused to pass through the T die 4 including the joint section 12 and the flat die 4', and ejected from the gap t of the die. In addition, in this embodiment, the average set temperature of the T die 4 is 200° C. The resin which is extruded from the die 4 becomes the resin film 23 while being reeled by the cooling roll 24 or the like (step S4 in FIG. 11). In this embodiment, the resin film 23 was obtained in the above method. When the resin film 23 obtained in this embodiment was examined by TEM (Transmission Electron Microscope), a foam cell having an average diameter of approximately 10 μm was formed therein.

Moreover, the element ratio of a surface of the resin film 23 produced in this embodiment, was measured by an X-ray photoelectron spectroscopic instrument (XPS). As a result, it was found that 1 at % (atomic percent) of Ag-derived element was contained. Moreover, it was found that the rate of reduction of the silver complexes was as extremely high as 90% and that most of the silver complexes were reduced to metal. It is considered that the reason that the silver complexes are mostly reduced with a high degree of efficiency is because the silver complexes contacting with the resin having the temperature higher than the decomposition temperature of the silver complexes, inside the heating cylinder.

As described above, by using the method of producing a resin molded article and the extruder of the present embodiment, the high-pressure fluid having the modifying material dissolved therein is impregnated in the molten resin inside the extruder, thus modification of the surface and the inside of the thermoplastic resin can be performed simultaneously with molding processing, and the modifying material can be efficiently impregnated in the thermoplastic resin for a short period of time. Moreover, in the production method and the extruder according to the present embodiment, the resin film with the modified surface or inside can be continuously produced as described above. Therefore, according to the production method and extruder of the present embodiment, a film-shaped resin molded article, in which the metallic fine particles (catalyst core) is impregnated in the vicinity of the surface, and on which electroless plating can be performed, can be produced at low cost.

Embodiment 2

In Embodiment 2, hexafluoro acetylacetonate palladium (II) complexes (Pd complexes) were used as the modifying material and, when introducing the high-pressure fluid and the modifying material into the molten resin, only the stop valve 5 was opened to introduce the high-pressure fluid and modifying material from the injector valve 19 provided on the flat die 4'. Except for the above change, the same processing as that in Embodiment 1 was used to produce the resin film. In addition, the thickness of the resin sheet molded by the T die 4 was reduced by an unshown stretching apparatus to produce a resin film a thickness of 0.1 mm. Further, in this embodiment, the same components as those in Embodiment 1 were used as the extruder 100, the thermoplastic resin and the high-pressure fluid.

In the present embodiment, a low flow rate of the supercritical carbon dioxide and of Pd complexes were introduced from the injector valve 19 provided on the flat die 4'. Specifically, in this embodiment, the flow rate of the supercritical carbon dioxide having the Pd complexes dissolved therein was adjusted to 5 ml/min by the flowmeter 8. Also, the inner pressure of the resin in the vicinity of the injector valve 19 was 12 MPa when introducing the supercritical carbon dioxide having the Pd complexes dissolved therein to the molten resin.

The Pd complexes have the property of being completely decomposed at approximately 150° C., thus the Pd complexes are decomposed and reduced to be a palladium metallic element for a short period of time, when being impregnated in the high-temperature thermoplastic resin inside the T die 4. On the other hand, since the amount of penetration of the supercritical carbon dioxide is small, it spreads gradually in the resin and released to the air from the leading end of the T die 4 (gap t). Therefore, in the production method of the present embodiment, the occurrence of foams of the resin can be prevented.

The entire surface on one side of the resin film produced in the present embodiment was blackened, and the element ratio of the surface of the resin was measured by the X-ray photoelectron spectroscopic instrument (XPS). As a result, it was found that 4 at % of Pd-derived element was contained in the surface of the resin film. Moreover, it was found that the rate of reduction was as extremely high as 85% and that most of the Pd complexes were reduced to metal.

As described above, it was found that, even when the supercritical carbon dioxide having the modifying material dissolved therein is introduced from a section other than the heating cylinder 13, the modifying material could be efficiently impregnated in the thermoplastic resin for a short period of time as with Embodiment 1, and that the same effects as Embodiment 1 could be obtained. Moreover, as in this embodiment, it was found that, by impregnating the supercritical carbon dioxide having the modifying material dissolved therein in the flat die 4', the modifying material could be impregnated on a surface of one side in the molded article.

Furthermore, in this embodiment, the resin film obtained in the above production method was immersed in the Ni electroless plating solution to perform electroless plating. As a result, an electroless plating film having good adhesiveness and luster was formed on a surface of the resin film.

Embodiment 3

In Embodiment 3, a cylindrical die was used in place of the T die 4 to produce a tube-shaped resin film. In the extruder 100 of this embodiment, a known inflation die (not shown) having a diameter Ø of 50 mm and a gap of 2 mm was attached to the heating cylinder 13 via a joint section (not shown). Further, four injector valves for impregnating the high-pressure fluid and the modifying material were attached to an outer peripheral section of the cylindrical die, and the high-pressure fluid and the modifying material were introduced to the molten resin from these injector valves. Moreover, in the extruder 100 of this embodiment, the uniaxial screw 3 was a full-flight screw with one axis. The configuration of extruder 100 is same as that described in Embodiment 1, except the above change.

In this embodiment, a liquid crystal polymer was used as the thermoplastic resin and hexafluoro acetylacetonate hydrate copper (II) complexes (Cu complexes) are used as the modifying material. As the supercritical fluid, the supercritical carbon dioxide was used as with that in Embodiments 1 and 2.

In the molded article production method of this embodiment, the number of revolutions of the screw 3 was 130 rpm, and the average set temperature of the heating cylinder 13 was 340° C. When introducing the supercritical fluid and modifying material from the injector valves attached to the inflation die, the flow rate of the supercritical fluid and of the modifying material was adjusted to 5 ml/min. The resin molded article (tube-shaped film of liquid crystal polymer) was produced in the same manner as Embodiment 2, except for the above described process.

In the tube-shaped film of liquid crystal polymer, which was produced in the above production method, the entire surface on one side (external wall side) of the film was discolored. When the element ratio of the surface of the resin was measured by the X-ray photoelectron spectroscopic instrument (XPS), it was found that 2.5 at % of Cu-derived element was contained. Moreover, it was found that the rate of reduction of the Cu complexes was as extremely high as 80% and that most of the Cu complexes were reduced to metal.

Furthermore, in this embodiment, the tube-shaped film of liquid crystal polymer obtained in the above production method was immersed in the Cu electroless plating solution to perform electroless plating. As a result, an electroless plating film having good adhesiveness and luster was formed on the surface (external wall) of the tube-shaped film.

As described above, it was found that, by using the molded article production method of the present embodiment, an electroless plating film could be formed for the liquid crystal polymer to which application of electroless plating was difficult heretofore.

It should be noted that in Embodiments 1 to 3, the high-pressure fluid, which is impregnated in the thermoplastic resin, can be used as a pneumatogen in the same manner as a known method. For example, a large amount of the high-pressure fluid can be impregnated in the plasticizing/melting cylinder to rapidly reduce the pressure when extruding the thermoplastic resin from the die to the air, whereby fine foam cells can be formed in the molded article.

Moreover, the extrusion molding methods according to Embodiments 1 to 3 can be applied to various methods of forming multilayer lamination. Here, as the method of forming multilayer lamination, for example, there is a method in which molten resins which are obtained from a plurality of extruders are combined in the form of the laminae by a feed block, thereafter sent to a normal single-layer T die and extruded as a multilayer film or sheet. Further, any type of resin layer may be modified by the molding method of the present invention and some layers of a plastic molded article having multilayer structure may be constituted with some layers in which a modifying material dissolved in the high-pressure fluid is impregnated. For example, a predetermined function may be added in some layers, and a function different from the predetermined function may be added in another some layers.

Embodiment 4

Embodiment 4 describes a method in which, after the resin film having metallic fine particles at least at a surface thereof is produced by the extrusion molding, an insert molding (in mold) is performed by using the resin film to produce a resin molded article. In addition, as a resin material which is used as the resin film, although any material can be used as long as it is a thermoplastic resin which can be subjected to extrusion molding, polycarbonate was used in the present embodiment. Further, although the modifying material to be impregnated in the resin film can be also any material, hexafluoro acetylacetonate palladium (II), which is the metal complex, was used in the present embodiment.

Extruder

Figure 3:
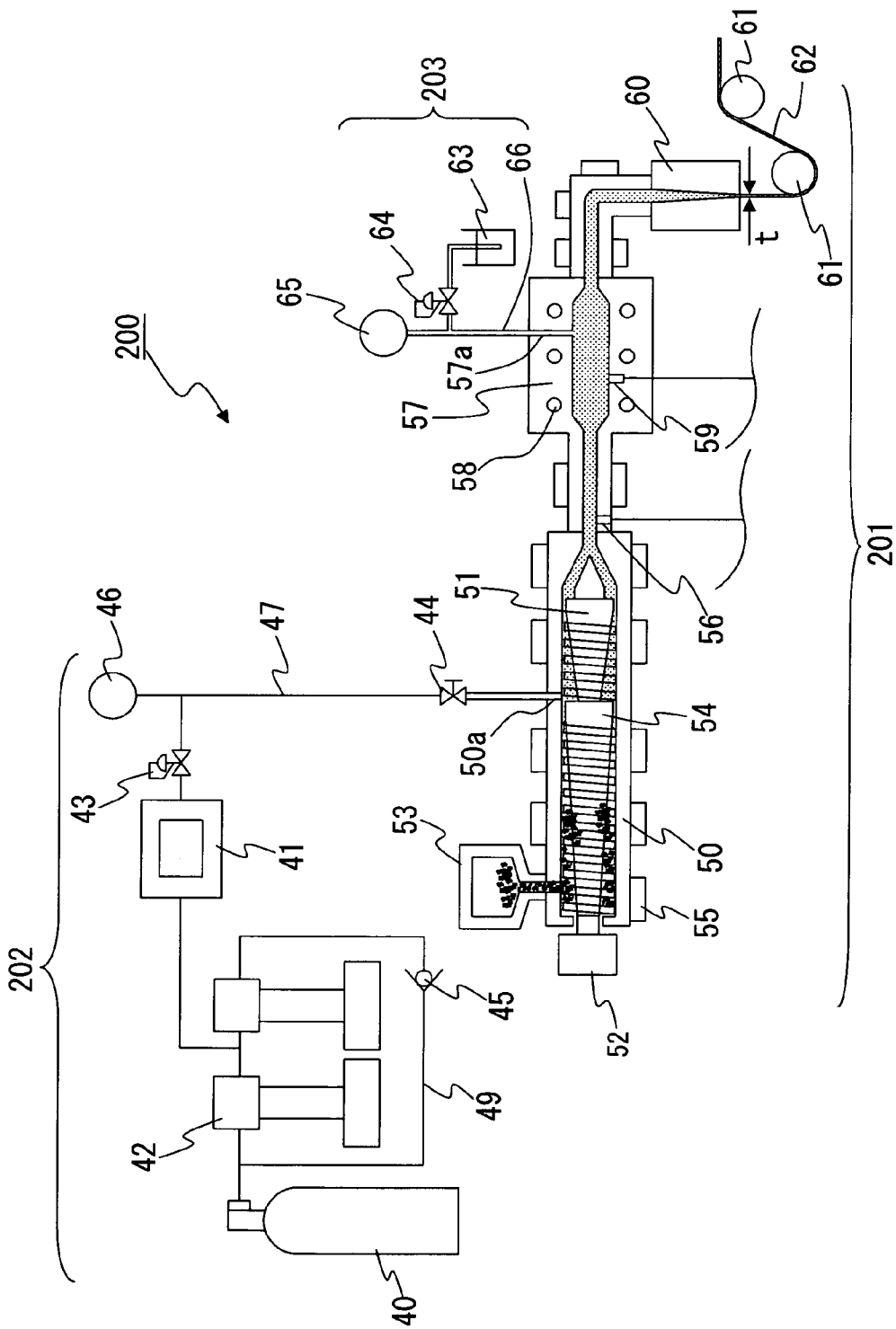
FIG. 3 is a schematic configuration diagram of an extruder which is used in a molding method of Embodiment 4.

First, the extruder which is used to produce the resin film is explained. FIG. 3 shows a schematic configuration diagram of the extruder used in this embodiment. As shown in FIG. 3, the extruder 200 which is used in this embodiment mainly includes an extruding section 201, a carbon dioxide supply section 202, and a carbon dioxide discharge section 203.

As shown in FIG. 3, the extruding section 201 mainly includes a plasticizing/melting cylinder 50 (also referred to as "heating cylinder" hereinafter), a hopper 53 which supplies a pellet of the resin into the heating cylinder 50, a motor 52 which rotates a screw 51 inside the heating cylinder 50, a cooling jacket 57, a die 60 which reduces the thickness of a molten resin and extrudes the molten resin while expanding it in a fan-like form, and a cooling roll 61. As the screw 51 in this embodiment, a uniaxial screw having a vent structure section 54 functioning as a pressure-reducing section was used.

The structure/system of the extruding die 60 is arbitrary and thus can be appropriately selected according to the shape and application of a molded article to be produced. In this embodiment, a T die for molding a film was used as the extruding die 60. In the extruder 200 of this embodiment, a resin film 62 which is extruded by the T die 60 is reeled by the cooling roll 61 or the like. In the present embodiment, a gap t at a die extruding port of the T die 60 was set to 0.5 mm.

Moreover, in the extruder 200 of this embodiment, as shown in FIG. 3, a injection port 50a for carbon dioxide was provided in the vicinity of the vent structure section 54, of the uniaxial screw 51, in which the pressure of the molten resin is reduced. Further, in the extruder 200 of this embodiment, as shown in FIG. 3, a monitor for measuring the internal pressure of the resin was provided in a connection section between the heating cylinder 50 and the cooling jacket 57 (monitor 56) and in the cooling jacket 57 (monitor 59).

As shown in FIG. 3, the carbon dioxide supply section 202 mainly includes a carbon dioxide bomb 40, a syringe pump 42, a dissolver 41, a backpressure valve 43, a valve 44, a pressure gauge 46, and a pipe 47 which connects these components. A downstream side (secondary side) of the valve 44 is connected to the injection port 50a for carbon dioxide in the heating cylinder 50 via the pipe 47 and communicated to a flow path of the molten resin inside the heating cylinder 50, as shown in FIG. 3. It should be noted that a location where the carbon dioxide is introduced is not limited to the above location, and thus the injection port can be provided at any location as long as it is in a region spanning from the screw 51 to the T die 60.

Moreover, as shown in FIG. 3, the carbon dioxide discharge section 203 mainly includes an extraction container 63 for discharging the carbon dioxide, a backpressure valve 64, a pressure gauge 65, and a pipe 66 which connects these components. An upstream side (primary side) of the backpressure valve 64 is connected to a carbon dioxide ejection port 57a of the cooling jacket 57 via the pipe 66 and communicated to a flow path of the molten resin inside the cooling jacket 57, as shown in FIG. 3.

It should be noted that in the extruder 200 of the present embodiment, the same constructions as the mechanisms of a known extruder can be used in the mechanisms of the screw 51, the heating cylinder 50, the die 60 and the like.

Method of Molding a Resin Film

Next, a method of molding a resin film of the present embodiment is described with reference to FIGS. 3 and 12. First, a sufficient amount of the pellet of the resin material (polycarbonate) was supplied to the hopper 58 of the extruding section 201, the resin material was then plasticized and molten by rotating the screw 51 with the motor 52 (step S1 in FIG. 12), and the molten resin was sent to a front edge of the heating cylinder 50. In this case, the temperature of the heating cylinder 50 was set to 280° C. by a band heater 55.

Next, the high-pressure carbon dioxide (high-pressure fluid) was caused to flow in the dissolver 41 in which the modifying material was placed in advance, thereby dissolving the modifying material in the high-pressure carbon dioxide (step S2 in FIG. 12). Specifically, the modifying material was dissolved in the high-pressure carbon dioxide in the manner described below. It should be noted that the method of dissolving the modifying material in the high-pressure carbon dioxide in the present embodiment is not limited to the method described hereinafter. For example, a storage container such as a bomb may be used in which is filled a high-pressure carbon dioxide having a modifying material dissolved therein in advance.

First, the pressure of liquid carbon dioxide which was supplied from the carbon dioxide bomb 40 was raised and adjusted by the syringe pump 42, and the pressure was adjusted so that the pressure gauge 46 shows 15 MPa. Next, the temperature of the pressurized high-pressure carbon dioxide is controlled at 40° C., the high-pressure carbon dioxide was then caused to flow in the dissolver 41 in which the modifying material was inserted (placed) so as to be supersaturated, and the modifying material was dissolved in the high-pressure carbon dioxide.

Next, the valve 44 was opened to introduce the high-pressure carbon dioxide having the modifying material dissolved therein to the vent structure section 54 of the heating cylinder 50 via the pipe 47 and injection port 50a, and then the modifying material and the high-pressure carbon dioxide were impregnated in the molten resin (step S3 in FIG. 12). On this occasion, a fixed flow rate of the high-pressure carbon dioxide having the modifying material dissolved therein was introduced while controlling the flow rate of the high-pressure carbon dioxide by the syringe pump 42 and controlling the pressure of the high-pressure carbon dioxide by means of the backpressure valve 43. In this case, the high-pressure carbon dioxide and the modifying material (metal complexes) which were injected into the molten resin of the vent structure section 54 are mixed with the resin by the rotation of the screw 51.

Next, the molten resin was extruded from the heating cylinder 50, while adjusting the pressure of the molten resin in which the high-pressure carbon dioxide and the metal complexes have been mixed, so that the internal pressure of the resin displayed in the monitor 56 is raised to 20 MPa. On this occasion, the metal complexes which have been dispersed in the molten resin are decomposed by sheared heat caused by the rotation of the screw 51, and transformed (reduced) to fine particles of metallic elementary substance which are insoluble in carbon dioxide.

The molten resin, which was extruded from the heating cylinder 50, was then caused to pass through the cooling jacket 57. In addition, the cooling jacket 57 is cooled to 200° C. by temperature-controlled water which flows in a cooling channel 58 provided in the cooling jacket 57. Further, in the extruder 200 of this embodiment, as shown in FIG. 3, the cross-sectional area of the flow path for the molten resin in the cooling jacket 57 is larger than the cross-sectional area of the flow path for the molten resin in the connection section between the heating cylinder 50 and the cooling jacket 57, thus, when the molten resin passes through the cooling jacket 57, reduction of pressure is carried out simultaneously with cooling. In this embodiment, when the molten resin passed through the cooling jacket 57, the pressure-reducing section of the resin internal pressure monitor 59 showed 10 MPa.

Moreover, in this embodiment, when the molten resin passed through the cooling jacket 57, the carbon dioxide (high-pressure carbon dioxide) which was impregnated in the molten resin was discharged (ejected) by the carbon dioxide discharge section 203. Specifically, the backpressure valve 64 of the carbon dioxide discharge section 203 was adjusted so that the pressure gauge 65 displays 10 MPa, and the carbon dioxide impregnated in the molten resin was then discharge and trapped in alcohol solvent inside the extraction container 63. In addition, in this embodiment, the components in the alcohol inside the extraction container 63 were analyzed. As a result, not only carbon dioxide but also low-molecular components such as monomer and oligomer remaining inside the polycarbonate resin were detected. These low-molecular components vaporize from an inside of the resin molded article when the temperature is high, and deteriorate the adhesiveness between a surface of the molded article and a metallic film laminated thereon. Therefore, in the resin molded article which is produced in the production method of the present embodiment, the components, which deteriorate the adhesiveness between the surface of the resin and the metallic film laminated thereon, can be reduced, thus the extrusion molding method of the present embodiment is suitable as a method of creating a resin molded article having a metallic film with high weatherability.

Next, the molten resin which was extruded from the cooling jacket 57 passed through the T die 60, and the resin 62, which was extruded from the T die 60, was reeled by the cooling roll 61 or the like and continuously molded into a form of a film (step S4 in FIG. 12). Then, in this embodiment, the thickness of the resin 62 was reduced by means of an unshown stretching apparatus to produce a resin film having a thickness of 0.1 mm. In this manner, the resin film of this embodiment was obtained.

The resin film produced in this embodiment was examined by a cross-section TEM (Transmission Electoron Microscope). As a result, palladium metallic fine particles having a diameter of approximately 30 nm were evenly dispersed on the surface and in the inside of the resin film.

Insert Molding

Figure 5:
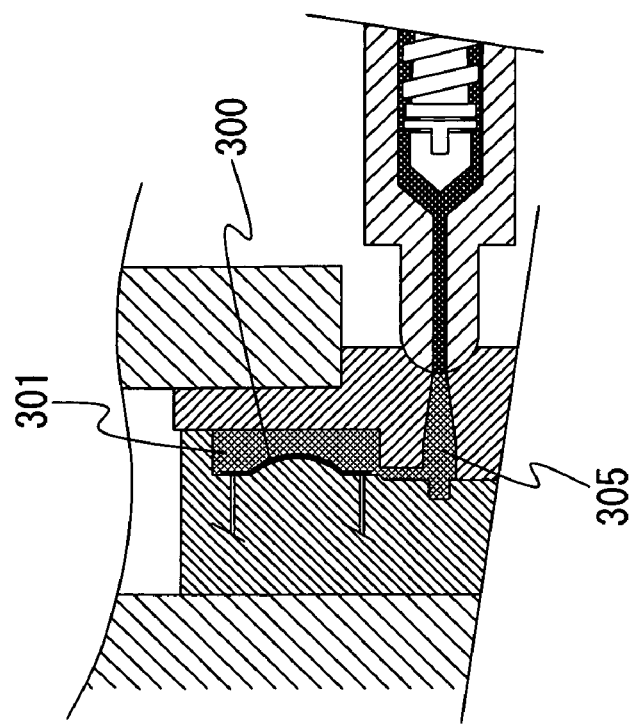
FIG. 5 is a figure for explaining a procedure of insert molding in Embodiment 4.

Next, a method of producing a resin molded article by the insert molding (in mold) using the resin film produced in the above extrusion molding is described with reference to FIGS. 4, 5 and 12. It should be noted that an injection molding apparatus 500 which is used in insert molding of this embodiment has the same structure as that of a conventional injection molding apparatus.

Figure 4:
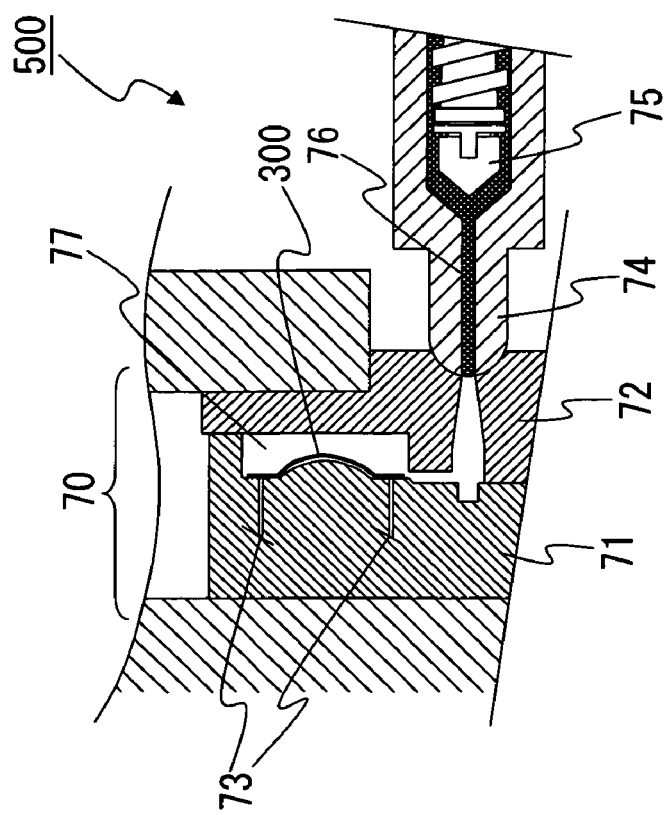
FIG. 4 is a figure for explaining a procedure of insert molding in Embodiment 4.

First, as shown in FIG. 4, the resin film 300 which was produced in the above extrusion molding was held on a surface on a cavity 77 side of a movable mold 71 of a mold 70 (step S5 in FIG. 12). In addition, in this embodiment, the movable mold 71 in which the surface on the cavity 77 side is in the form of a mirror curved surface is used, and the resin film 300 is held on the surface in the form of a mirror curved surface. It should be noted that the cavity 77 in the mold 70 is a space which is created with a fixed mold 72 and a movable mold 71. Moreover, in this embodiment, a vacuum 73 circuit of the movable mold 71 was used and the resin film 300 was caused to adsorb to a surface of the movable mold 71 to hold the resin film 300. In this case, as shown in FIG. 4, the resin film 300 may not be completely adhered to the surface of the movable mold 71, thus a gap may be generated in a part between the surface of the movable mold 71 and the resin film 300. In the present embodiment, in order to improve the adhesiveness between the resin film 300 and a mold surface or a resin material to be injected at the time of insert molding, a surface of the resin film 300 may have various known adhesive layers thereon.

Next, in a state in which the resin film 300 has been held inside the cavity 77 of the mold 70, a resin 76, which was plasticized/molten by a screw 75 of the injection molding apparatus 500, was injected into and filled in the cavity 77 via a spool of the injection molding apparatus 500 (step S6 in FIG. 12). In this case, as shown in FIG. 5, the resin film 300 is adhered to the mold surface by the injected resin (there is no gap between the resin film 300 and the mold surface), and the resin film 300 is molded into a predetermined shape (mirror shape). In this manner, in the present embodiment, a resin molded article in which the resin film 300 and a molded article base material 301 (molded article body) are integrated was obtained.

In this case, it should be noted that although the resin film 300 is sometimes subjected to plastic deformation or melting by the molten resin, the quality of the metallic film on a surface of the molded article is not affected at all. Moreover, in this embodiment, since the resin film 300 having a certain degree of elasticity is insert molded, no cracks are generated in the film held inside the mold, as with a conventional case in which a metallic film is insert molded.

In the method of producing a resin molded article according to the present embodiment, it should be noted that any resin material can be used as the filled resin material to be injection molded at the time of insert (in mold) mold. For example, synthetic fiber such as polyester fiber, polypropylene, polymethyl methacrylate, polycarbonate, amorphous polyolefin, polyether-imide, polyethylene terephthalate, liquid crystal polymer, ABS resin, polyamide-imide, biodegradable plastics such as polylactic acid, nylon resin, and a composite material obtained by combining these materials can be used. Moreover, resin materials in which are mixed various inorganic fillers such as glass fiber, carbon fiber, nano-carbon and the like can also be used. Further, the filled resin material may be same as or different from the material of the resin film, but the same material is preferably used in order to enhance the adhesiveness between the filled resin material and the material of the resin film. In the present embodiment, the same material as the material of the resin film, i.e. polycarbonate was injected and filled by the insert molding. However, a polycarbonate material having a 30% of glass fiber and a deflection temperature under load (ISO 75-2) of 148° C. was used.

Furthermore, in the method of producing a resin molded article according to this embodiment, by controlling the thickness of the resin film in which the modifying material such as a metallic fine particle has been impregnated, the amount of penetration or the depth of penetration of the modifying material in the resin molded article obtained after insert molding can be controlled.

The roughness of a surface of the resin molded article obtained by the insert molding of this embodiment was measured with a stylus surface-roughness measuring instrument (produced by KLA-Tencor Corporation). The arithmetic average roughness (Ra) was 5 nm and ten point height of irregularities (Rz) was 8 nm. From this a result, in the production method of the present embodiment, it was found that a resin molded article having an extremely smooth surface can be obtained.

FIG. 6 shows a schematic cross-sectional diagram of the resin molded article obtained by the above-mentioned insert molding. In the resin molded article, which was obtained when insert molding was completed, the molded article base material 301 and the resin film 300 in which metallic fine particles have been dispersed are integrated. Further, the glass fibers contained in the molded article base material 301 are not dispersed in the resin film 300.

Formation of a Metallic Film and Protective Film

In this embodiment, an electroless plating processing was further directly performed on the resin molded article obtained by the insert molding (step S7 in FIG. 12). Specifically, in this embodiment, a silver reflection coating was formed on the resin molded article obtained by the insert molding with a known silver mirror reaction. In addition, a compound liquid of ammoniacal silver nitrate solution with excess ammonia, or sodium hydroxide solution and glucose solution was used as silver plating solution. By this electroless plating, a resin molded article in which a silver reflection coating 302 was formed on the resin film 300 was obtained, as shown in FIG. 7.

In addition, when a reflection coating is formed by the electroless plating, it is generally preferred that various known protective films were formed on the reflection coating in order to improve the weatherability of the reflection coating. Especially, although the reflectance of a silver reflection coating is high, the silver reflection coating is easily oxidized and rusts, thus it is preferred that the silver reflection coating is protected by a known ultraviolet curable resin, an electroless plating film, or the like. Therefore, in this embodiment as well, a protective film was formed on the silver reflection coating 302 formed in the manner described above.

Although the type of the protective film is arbitrary, in this embodiment, the protective film was formed of an organic-inorganic hybrid material (Glasska produced by JSR) of acryl components and polysiloxane which can be applied to wet process and has a heat resistance of approximately 200° C., which is close to the heat resistance of glass, after thermal hardening. In this embodiment, a film which is formed of a material for the protective film and has a thickness of approximately 10 μm, was formed by dipping, on the resin molded article on which the silver reflection coating 302 was formed, and thereafter the film formed of the material for the protective film, was left under a 100° C. environment for two hours and cured to form the protective film. FIG. 8 shows a schematic cross-sectional diagram of the resin molded article obtained after the formation of the protective film. The film indicated with the number 303 in FIG. 8 is the protective film.

By the method of producing as described above, in this embodiment, the resin molded article in which the resin film 300, metallic reflection coating 302 and protective film 303 have been formed on the molded article base material 301 containing glass fibers was obtained. FIG. 9 is an enlarged cross-sectional view showing the vicinity of the resin film 300 in the resin molded article produced in this embodiment. In the resin molded article produced in this embodiment, as shown in FIG. 9, the metallic fine particles 400 are dispersed in the resin film 300, and the metallic fine particles 400 deposited on a surface of the resin film 300 act as a catalyst core when the metallic reflection coating 302 is formed by the electroless plating.

The resin molded article of the present embodiment shown in FIG. 9 was left in a 150° C. atmosphere for 200 hours to perform an environmental test. As a result, deformation of the resin molded article and separation or deterioration of the silver reflection coating were not observed.

As described above, the method of producing a resin molded article according to the present embodiment can easily produce a resin molded article having a metallic film formed thereon, for the resin material such as liquid crystal polymer to which application of electroless plating was difficult heretofore. Moreover, the method of producing a resin molded article according to the present invention is an inexpensive method of producing a resin molded article because particularly it can massively produce the resin molded article having a high-quality reflection coating, without performing an expensive dry process.

Embodiment 5

In Embodiment 5, a material mixed polyethylene glycol having a mean molecular weight of 200 with polyethylene glycol having a mean molecular weight of 2000 was used as the modifying material to produce a resin molded article by the insert molding method, in the same manner as Embodiment 4. A method of molding the resin molded article of the present embodiment is described with reference to FIG. 13.

First, in this embodiment, a resin film in which the modifying material has been dispersed therein, was produced by the extrusion molding in the same manner as Embodiment 4 (steps S1-S4 in FIG. 13). However, in this embodiment, when the molten resin having the polyethylene glycol and high-pressure carbon dioxide impregnated therein was allowed to pass through the cooling jacket 57, other low-molecular components contained in the carbon dioxide or resin in the molten resin were not discharge or extracted in the carbon dioxide discharge section 203. Except for this step, a resin film in which the modifying material has been dispersed on a surface and in the inside of the resin film was produced in the same manner as Embodiment 4.

Next, the resin film thus obtained by the extrusion molding was subjected to insert molding in the same manner as in Embodiment 4 (steps S5 and S6 in FIG. 13). Then, the resin molded article (resin molded article in which the resin film and the molded article base material are integrated), which was produced by the insert molding, was subjected to ultrasonic cleaning in ethanol solvent for 30 minutes to remove the polyethylene glycol (modifying material) dispersed in the vicinity of the surface of the resin molded article (resin film) (step S6' in FIG. 13). By performing this step, the resin molded article can be obtained in which micropores are formed in portions where the polyethylene glycol was removed.

As described above, in the method of producing the resin molded article according to the present embodiment, low-molecular components which are different from the material for the resin film and molded article base material (polyethylene glycol, in this embodiment) are removed in the solvent from the resin film, thus a resin molded article in which micropores are formed at least on a surface thereof can be obtained. It should be noted that the process of removing the low-molecular components from the resin film may be performed at any timing, thus this removal process may be performed before or after the insert molding. Further, the size of the micropore can be controlled within a range of the order of several nms to micron by the molecular weight of the low-molecular components (modifying material) or by the condition of the extraction and removal of the low-molecular components from the resin film.

The surface roughness of the resin molded article in which the micropores have been formed on the surface thereof as described above was measured in the same manner as Embodiment 4. As a result, the arithmetic average roughness (Ra) was 15 nm and ten point height of irregularities (Rz) was 130 nm. The surface roughness of the resin molded article of Embodiment 5 was larger than that of the resin molded article of Embodiment 4, which was obtained after insert molding. This result indicates that the low-molecular components (polyethylene glycol) dispersed in the surface of the resin film were removed and the micropores were formed. However, considering that the surface roughness of a molded article is approximately several microns when the conventional etching processing using chromic acid or permanganic acid is performed, it was found that in the resin molded article of the present embodiment, which was obtained after insert molding, a good surface roughness was obtained compared to the molded article which was roughened by means of the conventional etching processing.

Next, in this embodiment, the known electroless copper plating process was performed on the resin molded article in which the polyethylene glycol was removed (step S7 in FIG. 13). Specifically, a degreasing step by a conditioner (OPC-370 produced by Okuno Chemical Industries Co., Ltd.), an adding step of the catalyst (OPC-80 catalyst produced by Okuno Chemical Industries Co., Ltd.), a catalyst activation step by an accelerator (OPC-500 accelerator MX produced by Okuno Chemical Industries Co., Ltd.), and an electroless copper plating step were sequentially carried out. In addition, in the electroless copper plating step, OPC-750 electroless copper plating solution (produced by Okuno Chemical Industries Co., Ltd.) was used as the plating solution. In the degreasing step and the adding step of the catalyst, the ultrasonic oscillation was applied in order to contribute to immersion of a catalyst core and plating film on the resin film. As a result, the formed plating film did not have a blister and the adhesiveness obtained in a tape peeling test using cross hatches was good.

Figure 10:
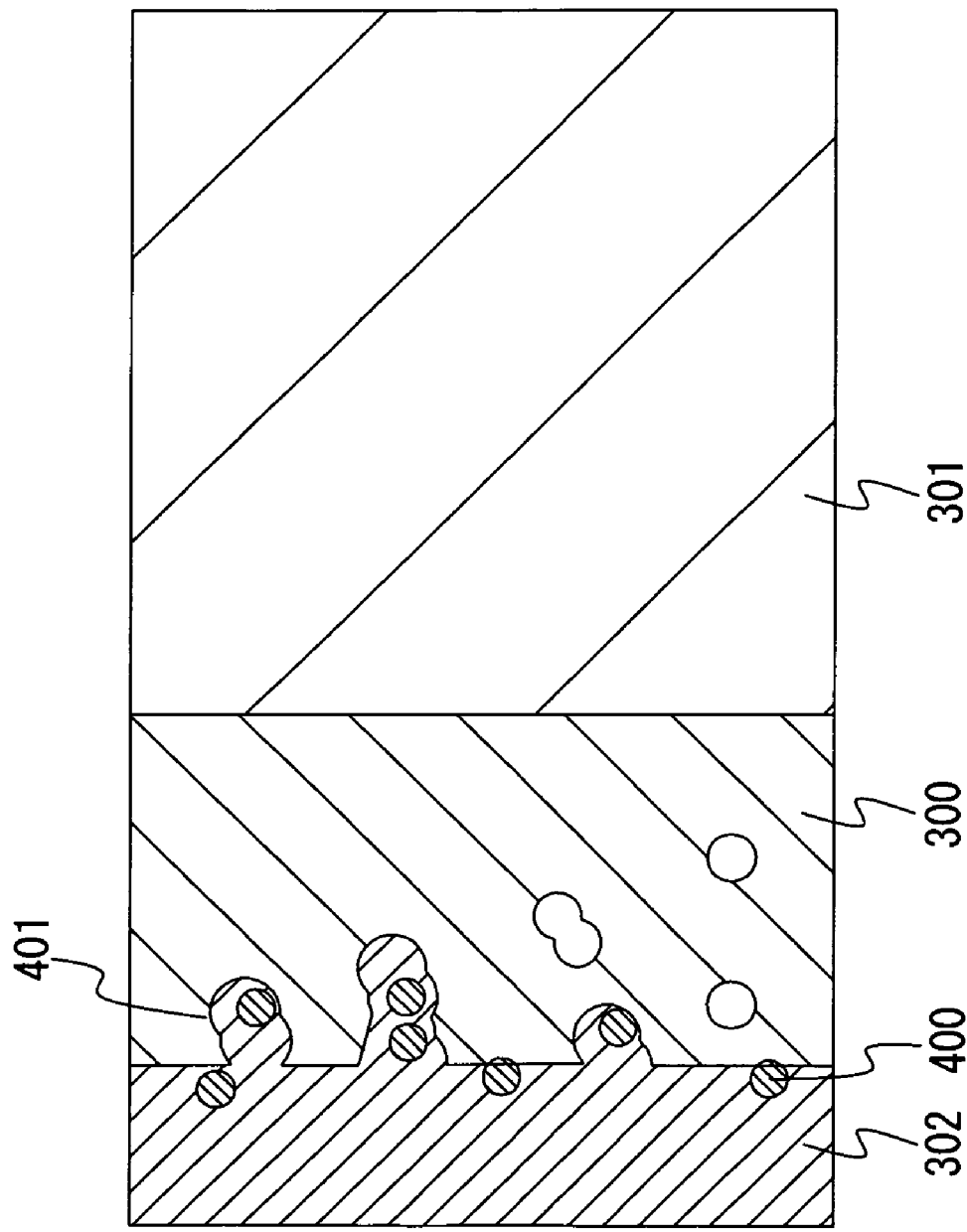
FIG. 10 is an enlarged schematic cross-sectional diagram showing the vicinity of a resin film of a resin molded article which was produced in Embodiment 5.

FIG. 10 is an enlarged schematic cross-sectional diagram showing the vicinity of the resin film of the resin molded article in which the plating film is formed on a surface thereof. In the resin molded article formed in this embodiment, since the modifying material (polyethylene glycol), which was dispersed in the vicinity of the surface of the resin film, was removed, thus micropores 401 are partially formed on the surface of the resin film 300 formed on the molded article base material 301, as shown in FIG. 10. Then, by the electroless plating, the catalyst core and the plating film were immersed in these micropores and an anchor effect was obtained due to the micropores 401 on the surface of the resin film 300. As a result, thus it is considered that the plating film having the strong adhesiveness was obtained. Namely, in the resin molded article of this embodiment, in which the plating film is formed, a strong anchor effect can be obtained in a state in which the surface is kept smooth as much as possible. Moreover, in the method of producing the resin molded article according to the present embodiment, the plating film can be easily formed on the resin materials, which could not be adequately roughened with the conventional etching process, for example, cycloolefin polymer, non-plated grade of polycarbonate, liquid crystal polymer or the like. Further, in the production method of the present embodiment, a surfactant may be used as with the conventional method so that the choroid of the palladium catalyst easily adheres to the molded article base material.

It should be noted that the modifying material, which is used in the method of producing the resin molded article according to this embodiment, may be any material as long as it is a low-molecular component which can be dissolved in the high-pressure carbon dioxide or removed in a solvent. For example, polyalkyl glycol such as polyethylene glycol, polyvinyl pyrrolidone, water-soluble polymer such as polyamidine, oligomer and monomer thereof, $\epsilon$-caprolactam, acrylamide or the like can be used. By using such water-soluble low-molecular materials, the modifying material can be easily removed from the surface of the resin by water or alcohol. Accordingly, any size of micropores can be formed on the surface of the resin molded article.

Moreover, the resin molded article in which micropores have been formed at least a part of the surface thereof by the production method of this embodiment can be used for the following purposes. For example, when biodegradable plastic such as polylactic acid is used as the material of the resin film, the resin molded article can be used as a regenerative medical device for cultivating the cells in the micropores. Moreover, when the size of the micropore is set to approximately 100 nm or less, which is sufficiently smaller than an wavelength of visible light, the refractive index of the surface of the molded article can be reduced by increasing the porosity. Furthermore, by providing an inclination to the porosity distribution between the surface and the inside of the resin film, the surface reflectance can be constrained. In this case, it is required that the porosity of the surface is larger than that of the inside of the resin film, but in the production method of the present embodiment, the more low-molecular components are extracted in the region close to the surface, thus the porosity distribution can be easily controlled. Moreover, the electroless plating process of the present embodiment for forming a metallic film can be easily applied to a large-area molded article having a complex shape.

According to the method of producing the molded article and the extruder of the present invention, the metallic fine particles can be impregnated effectively in the thermoplastic resin for a short period of time and the film-shaped resin molded article having the metallic fine particles impregnated on a surface or in the inside thereof can be continuously produced. Accordingly, the molding method and the extruder of the present invention are suitable as a method of inexpensively producing a film-shaped resin molded article on which electroless plating can be performed, and as a device for producing such resin molded article.

The molded article production method of the present invention can easily produce the resin molded article having metallic fine particles impregnated in a surface thereof, for a conventional resin material to which application of electroless plating was difficult. Therefore, the production method of the present invention is suitable as a method of forming a metallic film on the various types of resins.

What is claimed is:

1. A method of producing a molded article, comprising:
   performing a molding with an extruder having a heating cylinder and an extruding die, wherein the performing of the molding includes:
   impregnating a pressurized fluid containing a metal complex for electroless plating catalyst core, in a thermoplastic resin inside the extruding die; and
   continuously molding the thermoplastic resin into a form of a film by ejecting the thermoplastic resin in which the metal complex has been impregnated from the extruding die so that the metal complex is impregnated to only one side of the thermoplastic resin molded into the form of the film, and performing an insert molding with an injection molding apparatus having a mold, wherein the performing of the insert molding includes: holding the thermoplastic resin molded into the form of the film inside a cavity of the mold of the injection molding apparatus; and injecting a molten resin in the injection molding apparatus into the cavity in which the thermoplastic resin molded into the form of the film is held.

2. The method of producing the molded article according to claim 1, wherein when the pressurized fluid is impregnated in the thermoplastic resin, the metal complex impregnated in the thermoplastic resin is subjected to thermic reduction to transform into metallic fine particles so that the metallic fine particles are deposited on a surface of the thermoplastic resin.

3. The method of producing the molded article according to claim 1, wherein the method further comprises forming a metallic film on the thermoplastic resin molded into the form the film by electroless plating after the insert molding is performed.

4. The method of producing the molded article according to claim 3, wherein the metallic film is formed by a silver mirror reaction.

5. A method of producing a molded article, comprising:

performing a molding with an extruder having a heating cylinder and an extruding die, wherein the performing of the molding includes: melting a thermoplastic resin in the heating cylinder;

preparing a pressurized fluid containing a metal complex for electroless plating catalyst core;

bringing the pressurized fluid into contact with the thermoplastic resin which has been molten to impregnate the metal complex into the thermoplastic inside the extruding die; and continuously molding the thermoplastic resin into a form of a film by ejecting the thermoplastic resin in which the metal complex has been impregnated from the extruding die so that the metal complex is impregnated to only one side of the thermoplastic resin molded into the form of the film; and performing an insert molding with an injection molding apparatus having a mold, wherein the performing of the insert molding includes: holding the thermoplastic resin molded into the form of the film inside a cavity of the mold of the injection molding apparatus; and injecting a molten resin in the injection molding apparatus into the cavity in which the thermoplastic resin molded into the form of the film is held.

6. The method of producing the molded article according to claim 5, wherein when the pressurized fluid is impregnated in the thermoplastic resin, the metal complex impregnated in the thermoplastic resin is subjected to thermic reduction to transform into metallic fine particles so that the metallic fine particles are deposited on a surface of the thermoplastic resin.

7. The method of producing the molded article according to claim 5, wherein the method further comprises forming a metallic film on the thermoplastic resin molded into the form the film by electroless plating after the insert molding is performed.

8. The method of producing the molded article according to claim 7, wherein the metallic film is formed by a silver mirror reaction.

* * * * *